United States Patent
Ito

(10) Patent No.: US 6,703,261 B2
(45) Date of Patent: Mar. 9, 2004

(54) SEMICONDUCTOR DEVICE AND MANUFACTURING THE SAME

(75) Inventor: Mamoru Ito, Tamamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/352,023

(22) Filed: Jan. 28, 2003

(65) Prior Publication Data

US 2003/0153128 A1 Aug. 14, 2003

Related U.S. Application Data

(62) Division of application No. 10/318,018, filed on Dec. 13, 2002.

(30) Foreign Application Priority Data

Feb. 6, 2002 (JP) .......................................... 2002-029598

(51) Int. Cl.[7] .......................... H01L 21/44; H01L 21/48; H01L 21/50
(52) U.S. Cl. ....................... 438/122; 438/121; 438/123; 438/124; 438/611; 29/827; 361/717; 361/718; 361/719; 361/723
(58) Field of Search ................................ 438/121–124, 438/611; 361/717–719, 723; 29/827

(56) References Cited

U.S. PATENT DOCUMENTS

| | | | | |
|---|---|---|---|---|
| 4,758,927 A | * | 7/1988 | Berg | 361/401 |
| 4,888,307 A | * | 12/1989 | Spairisano et al. | 264/272.17 |
| 5,949,649 A | * | 9/1999 | Bartlow | 361/704 |
| 6,091,341 A | * | 7/2000 | Nose et al. | 340/5.28 |
| 6,362,964 B1 | * | 3/2002 | Dubhashi et al. | 361/707 |

OTHER PUBLICATIONS

Spitz et al., US Patent Application Publication 2003/0142480, Jul. 31, 2003.*

Kurihara et al., US Patent Application Publication 2002/0025606, Feb. 28, 2002.*

* cited by examiner

Primary Examiner—David A. Zarneka
(74) Attorney, Agent, or Firm—Miles & Stockbridge P.C.

(57) ABSTRACT

A semiconductor device is disclosed in which a heat sink is difficult to warp and which is inexpensive. The semiconductor device comprises a heat sink, a pair of screwing pieces having respective inner end portions connected to both ends of the heat sink and further having outer end portions respectively formed with through spaces for screwing, one or more semiconductor chips fixed to a main surface of the heat sink, a seal member formed of an insulating resin which covers a back side of the heat sink and also covers the other portions of the paired screwing pieces than the outer end portions, a first lead having an outer end portion projecting from the seal member and further having an inner end portion which is positioned within the seal member and whose inner end is arranged near one side face of the heat sink, a second lead having an outer end portion projecting from the seal member and further having an inner end portion positioned within the seal member and near another side face of the heat sink, and plural conductive wires for electrically connecting between the leads and predetermined electrodes of a predetermined semiconductor chip, or between the leads and predetermined electrodes of a predetermined semiconductor chip and also between predetermined electrodes of a predetermined semiconductor chip and predetermined electrodes of a predetermined semiconductor chip.

6 Claims, 24 Drawing Sheets

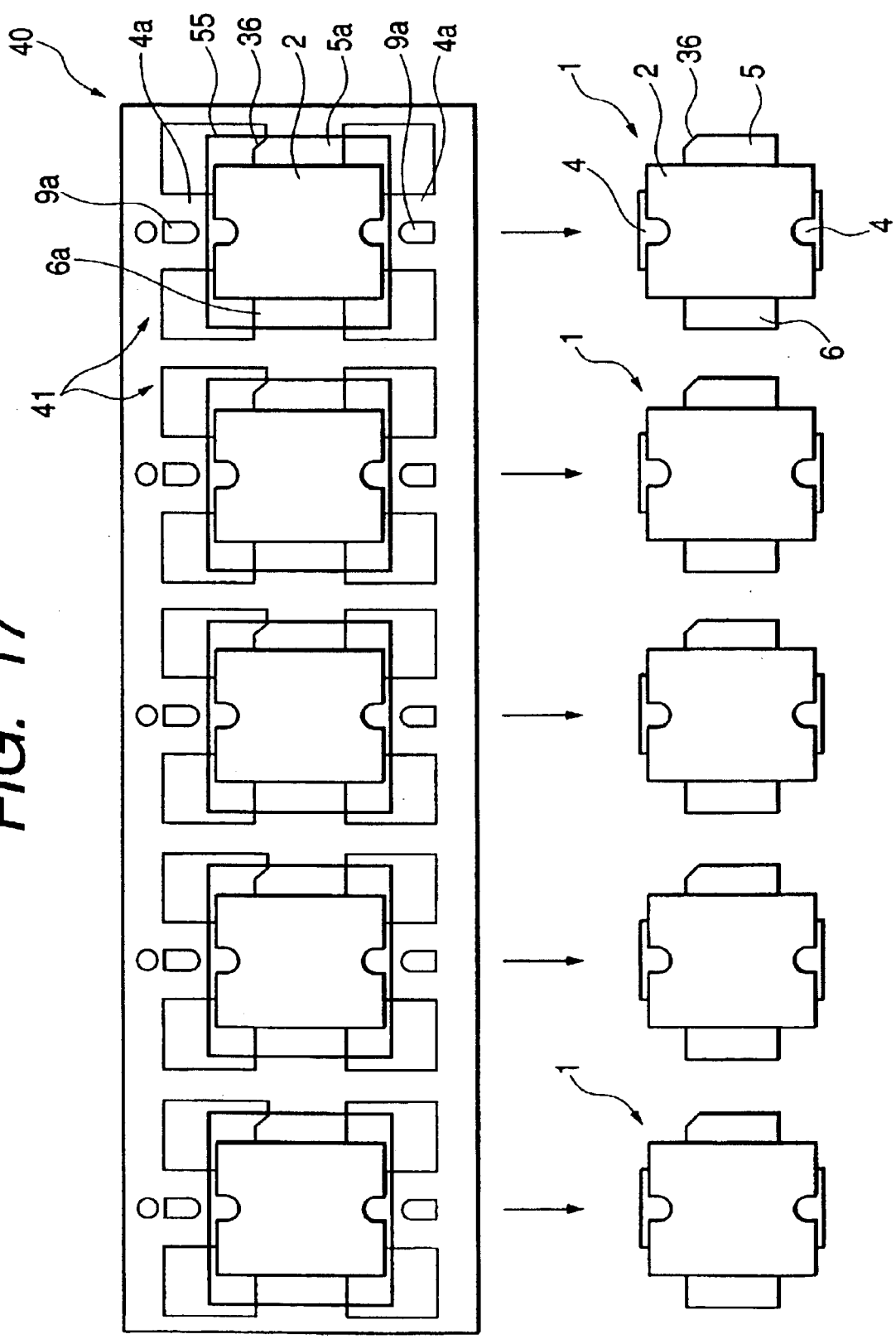

SEMICONDUCTOR DEVICE AND MANUFACTURING THE SAME

CROSS-REFERENCE TO RELATED APPLICATIONS

This application is a divisional of application Ser. No. 10/318,018 filed Dec. 13, 2002.

BACKGROUND OF THE INVENTION

The present invention relates to a semiconductor device and a method of manufacturing the same. Particularly, the invention is concerned with a technique which is effectively applicable to a manufacturing technique for a high frequency power amplifier (high frequency power amplifier module) for a base station in a radio communication system such as a cellular communication system.

SUMMARY OF THE INVENTION

In a radio communication system such as a cellular communication system, a portable telephone set (a portable terminal) is connected to a base station adjacent to a telephone network by a speaker's operation of the telephone set, then is connected successively to a single or plural base stations, and finally a portable terminal of the party being called is called (originating a call), thereafter the portable telephone set assumes a state which permits talking with the called party. In this case, the base station amplifies the received signal and transfers the thus-amplified signal. Such an amplification is performed by means of a high frequency power amplifier for a base station.

Having made studies about the cost reduction of a high frequency power amplifier for a base station, the present inventor reviewed a sealing structure (package structure) as a main cause of high cost.

FIGS. 28 to 39 illustrate a semiconductor device (hereinafter referred to as the "studied semiconductor device") which the present inventor had studied prior to the present invention. The studied semiconductor device is a high frequency power amplifier (a high frequency power amplifier module). FIG. 28 is a plan view of the studied semiconductor device, FIG. 29 is a side view thereof, FIG. 30 is a plan view thereof with a cap removed, and FIG. 31 is a schematic sectional view of the studied semiconductor device shown in FIG. 30.

A semiconductor device 70 is manufactured using a rectangular substrate 71. The substrate 71 is formed of a metal (e.g., CuMo plate) which is superior in thermal conductivity so that heat generated from a semiconductor chip is transferred promptly to an installed radiation board or mounting substrate, thus serving also as a heat sink.

A quadrangular frame 72 is fixed by bonding (silver soldering) centrally onto the substrate, or heat sink, 71, the frame 72 having a width smaller than the width of the heat sink 71 and having a length shorter than long sides of the heat sink 71. The heat sink 71 serves as a source electrode. Screwing grooves 73 are formed centrally of both ends of the heat sink 71 at positions spaced apart from the frame 72.

As shown in FIG. 31, the frame 72 comprises a frame-shaped ceramic base 74 and two frame-shaped ceramic sleeves 75 superimposed successively on the ceramic base 74. A metallized surface layer 75a (the dotted region in FIGS. 28 and 30) is formed on the surface of the upper ceramic sleeve 75.

Along the width of the heat sink 71 the ceramic sleeves 75 are superimposed one on the other at the same width as the width of the ceramic base 74 so that their inner and outer wall surfaces are in registration with the ceramic base, while in the long sides of the heat sink 71 the ceramic sleeves 75 are smaller in width than the ceramic base 74 and the surface of the ceramic base is exposed to both inside and outside of the ceramic sleeves 75.

On the surface of the ceramic base 74 extending along the long sides of the heat sink 71 there is formed an electrically conductive metallized layer 76. Consequently, the metallized layer 76 is exposed to the surface portions of the ceramic base 74 inside and outside the ceramic sleeves 75. The metallized layer portions located inside the ceramic sleeves 75 serve as bonding posts 76a for wire connection, while the metallized layer portions located outside the ceramic sleeves 75 serve as lead connecting portions 76b for lead connection.

An inner end of a drain lead 77 formed of a broad metallic plate is fixed to the lead connecting portion 76b extending along one long side of the heat sink 71, and an inner end of a gate lead 78 formed of a broad metallic plate is fixed to the lead connecting portion 76b extending along the other long side of the heat sink 71. One corner of the drain lead 77 is cut off obliquely, serving as an electrode index 77a for recognition of a drain electrode (see FIG. 28). The metallic plates which constitute the drain lead 77 and the gate lead 78 are formed of Kovar or Fe—Ni alloy, having such characteristics as thermal expansion coefficient and thermal expansion coefficient difference of ceramic being small and has a resistance to a high temperature in silver soldering.

On an upper surface of the heat sink 71 located inside the frame 72 there are fixed a capacitor chip 79, an SiMOSFET chip 80, and a capacitor chip 81 side by side from the drain lead 77 toward the gate lead 78. In the capacitor chips 79 and 81, an oxide film ($SiO_2$ film) is formed on a silicon substrate and an electrode is formed thereon to afford a predetermined capacitance. The silicon substrate serves as one electrode, while the electrode on the oxide film serves as the other electrode. These chips are fixed by AuSi eutectic, which is satisfactory in heat radiating property and electric conductivity and high in reliability, to the heat sink 71 formed of a metallic plate, so that there is ensured an electric contact between the substrate-side electrode of each chip and the heat sink 71 and there is obtained a satisfactory heat radiating property.

As shown in FIG. 30, one end of each conductive wire 82 is connected to a drain electrode 80d on the SiMOSFET chip 80, while an opposite end thereof is connected to an upper electrode 79a of the capacitor chip 79 at a position close to the drain lead 77. Likewise, one end of each conductive wire 83 is connected to the upper electrode 79a of the capacitor chip 79, while an opposite end thereof is connected to the bonding post 76a which is connected electrically to the drain lead 77. Further, one end of each conductive wire 84 is connected to one end of a gate electrode 80g on the SiMOSFET 80, while an opposite end thereof is connected to an upper electrode 81a of the capacitor chip 81 located close to the gate lead 78. One end of each conductive wire 85 is connected to the upper electrode 81a of the capacitor chip 81, while an opposite end thereof is connected to the bonding post 76a which is electrically connected to the gate lead 78.

The wires 81 to 85 are formed of aluminum wires. As to the wires connected to drain and gate electrodes, there is adopted a structure wherein plural wires are connected in parallel to ensure current capacity and high frequency characteristic (see FIG. 30).

As shown in FIG. 28, a cap 87 is fixed to the frame 72. The cap 87 is formed of a ceramic plate. As shown in FIG. 29, in a peripheral portion on a back side of the cap 87, a plating film 87a is formed of AuSn in a frame shape correspondingly to the ceramic sleeves 75, and the ceramic sleeves 75 are fixed through the plating film 87a. That is, the cap 87 is fixed to the frame 72 hermetically (hermetic seal structure) through AuSn alloy.

Along a side face of the frame 72 there is formed a side metallized layer 76d, as indicated with dots in FIG. 29. The side metallized layer 76d provides an electric connection between the heat sink 71 serving as a source electrode and the surface metallized layer 75a, placing the surface metallized layer 75a at an equal potential to the source electrode.

Exposed portions of the heat sink 71, drain lead 77, gate lead 78, surface metallized layer 75a, side metallized layer 7d, and metallized layer 76 are wholly plated with Au.

It is difficult to reduce the manufacturing cost of such a semiconductor device. More particularly, (1) a heat sink made of CuMo is closely similar in thermal expansion coefficient to a semiconductor chip formed of a ceramic material or Si and exhibits a package stress diminishing effect; besides, it is superior in heat radiating property, so it becomes possible to ensure a stable operation of the associated semiconductor device. However, the material cost is high and machining is troublesome, leading to an increase of cost. In the structure of the semiconductor device, moreover, the size of the heat sink used is large and hence an increase of cost results.

(2) Thick gold plating is needed for ensuring a required heat resistance in AuSi eutectic chip bonding, but a selective gold plating is difficult and there must be adopted a whole-surface plating method, with consequent increase of cost. It is necessary that the gold plating be performed to a thickness sufficient to ensure such a heat resistance as prevents the occurrence of discoloration of plating due to heating in chip bonding. For AuSi eutectic, in which heating is made to about 430° C., a plating thickness of 2 $\mu$m or more is needed, constituting one of causes of an increased cost.

(3) AuSn sealing work costs high. Besides, there is obtained a package of a hollow structure and a hermetic seal structure, so it becomes necessary to conduct a hermetic seal leak inspection and a movable dust particle inspection (dust particle inclusion inspection) as additional works, thus resulting in that the inspection cost further increases.

In more particular terms, since reliability depends on whether hermetic seal performance is good or not, it is necessary to conduct a hermetic seal leak inspection, which causes an increase of the assembling cost. Moreover, the management of oxygen control is important for ensuring a high hermetic seal performance, which causes deterioration of the sealing work efficiency and hence an increase of the assembling cost.

Further, if a hollow package is sealed with electrically conductive dust particles mixed therein, the dust particles move around the interior of the package under vibrations imparted to the package from the exterior. If the moving dust particles span the electrodes, there is a fear that an electrically semi-shorting defect may result, thus requiring the dust particle inclusion inspection as an essential condition.

On the other hand, a review of the semiconductor device 70 from the standpoint of electrical characteristics has revealed that the following problems are involved therein.

In the case of a base station for mobile telephone, the frequency is about 0.8 to about 2.1 GHz and an output as large as 60 to 250 W is required as the output of a final-stage power amplifying FET. A supply voltage of an amplifier which uses MOSFET (Metal Oxide Semiconductor Field-Effect-Transistor) made of Si as FET for output is about 28V, so in the case of an FET with an output of 125 W and a drain efficiency of about 50%, an average current is about 9 A and a peak current reaches 27 A which is about three times as large as the average current.

Since such a large current is handled, it is necessary to use a large-sized FET chip with a gate width of 20 cm or so, and input and output capacitances become as large as nearly 150 PF and 80 PF, respectively, resulting in the device being very low in impedance ACwise. For this reason, a high frequency loss increases at a frequency band of 1.5 GHz or higher. For avoiding this inconvenience, an internal matching circuit is included between FET chip and package electrode leads to increase the impedance of the lead portions.

FIG. 32 is an equivalent circuit diagram in which internal matching circuits are provided on an input side (gate side) and an output side (drain side), respectively. Between a gate electrode 80g of SiMOSFET chip 80 and an input terminal Pin is formed an input matching circuit by inductances L1, L2 of wires 85, 84, capacitance C1 of the capacitor chip 81, and input capacitance Ciss of SiMOSFET chip 80.

Further, between a drain electrode 80d of SiMOSFET chip 80 and an output terminal Pout is formed an output matching circuit by inductances L3, L4 of wires 82, 83, capacitance C2 of the capacitor chip 79, and output capacitance Coss of SiMOSFET 80. A source electrode 80s for the drain electrode 80d, as well as one terminals of the capacitors, are connected to ground (GND).

With the input matching circuit, an impedance of several ten ohms is converted to a low impedance of 1 ohm or less, while with the output matching circuit, an impedance of 1 ohm or less is converted to an impedance of several ten ohms, thus permitting an efficient power amplification.

The wires 82 to 85 serve as appropriate inductances for a desired frequency characteristic and the wire length (wire loop shape) is designed so as to form an internal matching circuit.

However, for forming the internal matching circuit it becomes necessary to ensure an additional space for the capacitor chips 79 and 81, which is disadvantageous to the needs for the reduction of size, and it is also necessary to perform a wire bonding work many times in a uniform loop shape, which causes a deteriorated yield in assembly.

Now, with reference to FIG. 33, a description will be given about a sectional structure of SiMOSFET 80 and a current path thereof. FIG. 33 illustrates a section and current path of a horizontal type SiMOSFET chip used for high frequency power amplification.

The horizontal SiMOSFET has a p$^+$ silicon substrate 90 of a high concentration and a p$^-$ epitaxial layer 91 of a low concentration which is formed on the p$^+$ silicon substrate 90 for obtaining a required voltage proof. In a surface portion of the p$^-$ epitaxial layer 91 are formed a channel-forming p layer 92 and a drain n$^+$ layer 93 of a high concentration which is located at a position spaced a predetermined distance from the channel-forming p layer 92. Further, an n$^-$ drain offset layer 94 of a low concentration is formed in the surface layer portion of the p$^-$ epitaxial layer 91 from the drain n$^+$ layer 93 up to the channel forming p layer 92.

The channel-forming p layer 92 is formed relatively deep and a source-forming n$^+$ layer 95 of a high concentration is formed on the left-hand side of a surface portion of the channel-forming p layer 92. The region from the left end of the source-forming high concentration n$^+$ layer 95 up to the pn junction formed of both channel-forming p layer 92 and n⁻ drain offset layer 94 serves as a channel-forming region.

A p⁺ through diffusion layer 96 of a high concentration is formed throughout a depth extending from the left end of the source-forming high concentration n⁺ layer 95, past the p⁻ epitaxial layer 91, up to a surface portion of the p⁺ silicon substrate 90. An insulating film (oxide film 97 is formed selectively on the surface of the p⁻ epitaxial layer 91. The insulating film 97 extends from an intermediate position of the source-forming high concentration n⁺ layer 95 up to an intermediate position of the drain n⁺ layer 93. At the right end of the insulating film 97 a drain electrode 80d is formed on the drain n⁺ layer 93, and at the left end of the insulating film 97 a source wiring line 80sa is formed from the source-forming high concentration n⁺ layer 95 onto the p⁺ through diffusion layer 96.

At a position deviated from the channel forming region, a source field plate 98 is provided on the insulating film 97 which overlies the n⁻ drain offset layer 94. The source field plate 98 is fixed at a source potential and is improved in drain voltage proof by relaxing an electric field.

The insulating film 97 is thinned at its portion opposed to the channel-forming region, which thinned portion serves as a gate insulating film (oxide film) 97a. A gate electrode 80g is formed on the gate insulating film 97a and is electrically connected to a gate wiring line 80ga which extends onto the insulating film 97.

By a high accuracy by both ion implantation technique and diffuison technique, p- and n-type diffusion layers (regions) are formed, whereby an n-channel enhancement type MOSFET is formed.

In such a device structure, a thick-line arrow shown in FIG. 3 represents a current path, along which an electric current 99 flows through the drain electrode 80d, drain n⁺ layer 93, n⁻ drain offset layer 94, channel-forming p layer 92, source-forming high concentration n⁺ layer 95, source wiring line 80sa, p⁺ through diffusion layer 96, and p⁺ silicon substrate 90, and reaches the source electrode 80s.

Current control is made by increasing or decreasing the gate potential, but since the horizontal FET is an enhancement type, it has a structure such that the drain current increases with an increase in gate potential and is cut off as the gate potential approaches 0V. Thus, there accrues an advantage that a minus power supply for gate bias which is necessary for a depletion type GaAsFET can be omitted and that therefore it is easy to implement a set circuit configuration.

The conventional high frequency power amplification using the horizontal FET is approximately class B amplification, in which a power component based on ON/OFF switching operation of a specified frequency is accumulated in a tank circuit constituted by both inductor and capacitor and a high frequency power is taken out by a matching circuit. Therefore, the higher the drain voltage and the larger the drain current capable of being flowed, the higher the output obtained in FET concerned, but for following up a high frequency operation it is necessary that the capacitance be small and mutual inductance (Gm) be large, so there is made such a chip design as affords high voltage proof, low capacitance, and high Gm. For attaining low capacitance and high Gm of FET chip, microminiaturization of gate length is necessary and is now a trend in FETs for high frequency amplification.

As a great factor of obstructing the attainment of high Gm there is mentioned source resistance. If an apparent Gm observed in an actual FET is assumed to be Gm' (exteriorly measurable Gm), Gm' can be represented by the following relationship between true Gm (=Gmint) and source resistance (=Rs):

$$Gm'=(Gmint)/(1+Rs\times Gmint) \tag{1}$$

Thus, for improving the performance of FET, the resistance diminishing processings subsequent to the formation of source n layer (source-forming high concentration n⁺ layer 95) shown in terms of the foregoing current path are important, and the decrease of contact resistance between the source electrode (=Si substrate) and the heat sink is an important subject in the assembling process. More particularly, the AuSi eutectic chip bonding method is suitable, including the point of high heat radiating performance, and is applied while imposing such a condition as does not develop voids in AuSi eutectic.

Now, with reference to FIGS. 34 and 35, a description will be given below about problems involved in space margin which are an obstructing factor against the reduction in size of a heat sink as an expensive component.

FIG. 34 is a side view as seen from a side face of the package for explaining a space margin which is necessary for chip bonding of the SiMOSFET 80. For chip bonding, the SiMOSFET chip 80 is chucked and conveyed by a chip bonding collet 100 and is pushed and scrubbed against a predetermined portion of the heat sink 71 heated to about 430° C. (Au foil now shown is affixed beforehand to the chip bonding portion of the heat sink to facilitate the formation of AuSi eutectic), allowing AuSi eutectic 111 to be developed for fusion-bonding.

In this case, scrubbing is necessary for preventing the generation of voids in AuSi, and the larger the size of chip, the greater the degree of scrubbing is needed. Since it is necessary for the collet 100 to embrace the FET chip, the size of the collet is larger than that of the FET chip 80.

It is necessary that a space margin be ensured an amount sufficient to prevent abutment of a collet end against the ceramic base 74 when scrubbing width is added to the collet size. Further, it is necessary that a positional variation margin of the frame 72, a ceramic size variation margin, and a collet position accuracy margin be added thereto. The total is about 1 mm.

FIG. 35 is a sectional view as seen from a package side face for explaining the space margin of a bonding posts 76a necessary for wire bonding. In wire bonding, with use of a wire bonding tool 113, wire 112 is first-bonded (1st bonding) to an Al electrode (not shown) of the FET chip 80, then is second-bonded (2nd bonding) to an Al electrode (not shown) of the capacitor chip 81 on the drain lead 77 side in the illustrated example. Next, with an electrode (not shown) of the capacitor chip 81 as the 1st bonding side, the wire is moved onto the bonding post 76a of the ceramic base 74 to which the drain lead 77 is fixed, and the wire 112 formed of Al is pushed against the bonding post 76a with the bonding tool 113 and is subjected to ultrasonic compression bonding to effect 2nd bonding. Thereafter, the bonding tool 113 is raised while allowing the wire 112 to be clamped by the bonding tool to tear off the wire from the 2nd-bonded portion.

In this case, as shown in FIG. 35, it is necessary to ensure such a margin as prevents abutment of an end portion of the bonding tool 113 and the wire 112 against a ceramic sleeve 75. The larger the height of the ceramic sleeve 75, or the obtuser the feed angle of the wire 112, the larger is required the length of the bonding post 76a, thus obstructing the reduction of size.

In a conventional ultrasonic Al wire bonding, the lower the Al wire feed angle, the smaller the variations in compression-bonded shape of Al and the higher the yield in assembly. For this reason, the lower the Al wire feed angle, the more desirable. On the other hand, however, it is necessary that the size of the bonding post 76a be made large. As a result, there may occur an increase of cost due to an increase in package size, or an increase of electrode capacitance may exert an influence on characteristics.

Next, with reference to FIGS. 36 to 39, the following description will be provided about the case where the semiconductor device 70 is attached to a set radiation plate and also about problems involved therein. FIG. 36 is a plan view of the semiconductor device 70 as screwed to a set radiation plate and FIG. 37 is a schematic sectional view thereof.

The semiconductor device 70 is mounted in the following manner. Screws 115 are inserted into screwing grooves 73 formed in both ends of the heat sink 71 and the substrate 71 is fixed to a mounting substrate 116 with the screws 115. The drain lead 77 and the gate lead 78 are connected to predetermined wiring portions of the mounting substrate 116 through a bonding material (e.g., PbSn solder). In connection with fixing the heat sink 71 as a radiation board to the mounting substrate 116, a tightening torque in the fixing work is prescribed for suppressing an increase in both thermal and electrical resistances.

In actual mounting, for preventing contact imperfection caused by the generation of an intermetallic compound between Au plating on the surfaces of drain and gate leads 77, 78 and PbSn solder, it is necessary to perform a work for removing Au plating from the leads before the mounting. Generally, it is necessary to conduct a preliminary soldering work of dipping the leads into a solder dipping vessel, allowing the Au plating to be diffused into the solder vessel. Such wasteful labor and time are required.

As a countermeasure the application of a selective Au plating method is considered so as not to plate the lead portions with Au. However, unlike the selective Au plating for such a material as a lead frame material capable of being conveyed continuously, close to a two-dimensional structure, masking is difficult for a ceramic package which is of a three-dimensional structure and which is basically conveyed one by one. Thus, the productivity of selective Au plating is low and whole-surface Au plating costs lower than selective Au plating. Even if Au plating is thinned for only the leads, there arises the problem of discoloration on heating in chip bonding, so Au plating is applied thick throughout the whole surface.

Next, problems involved in such screw mounting of the semiconductor device will be described with reference to FIGS. 37 to 39. FIG. 37 is a schematic sectional view of the studied semiconductor device as screwed to a mounting substrate, FIGS. 38(a) and 38(b) are schematic diagrams showing the semiconductor device wherein a substrate is warped in a centrally depressed state, as well as a mounted state thereof, and FIGS. 39(a) to 39(c) are schematic diagrams showing the semiconductor device wherein a substrate is warped in a centrally raised state, as well as a mounted state thereof.

From the standpoint of heat radiating performance it is preferable that the substrate (heat sink) 71 be in such a flat state as shown in FIG. 37. However, due to a bimetal effect inducted by thermal stresses among the metallic heat sink 71, the ceramic frame 72 fixed to the heat sink 71, and the metallic cap 87, there actually occurs a concave warp wherein the substrate center is recessed as in FIGS. 38(a) and 38(b) or a convex warp wherein the substrate center is raised as in FIGS. 39(a) to 39(c). The heat sink 71 and the frame 72 are bonded together by silver solder 117. In these figures the ceramic portion is not bent, but actually there also is a case where the ceramic portion is bent.

In the case where the heat sink 71 is concavely warped as in FIG. 38(a), if the heat sink is screwed to the mounting substrate 116, as in FIG. 38(b), the heat sink which is in a concavely warped state is corrected to the flat side, so that a tensile stress is imposed on the frame 72 formed of a ceramic laminate and there easily occurs a crack C.

On the other hand, in the case of such a convex warp as shown in FIG. 39(a), a compressive stress is imposed on the frame 72 formed of a ceramic laminate due to a screwing stress as in FIG. 39(b), so the breakage of ceramic is difficult to occur. However, as shown in FIG. 39(c), since a gap G is formed in the heat radiation path to the mounting substrate 116, a thermal resistance Rth increases and there arises the problem that both reliability and heat radiating performance are deteriorated.

As a measure against such warps it is considered to use a sufficiently thick heat sink material so as to make the heat sink difficult to warp, and conduct the selection of a heat sink warp. In this case, however, the material cost increases, with consequent increase in the cost of the semiconductor device.

It is an object of the present invention to reduce the material cost, reduce the cost of an assembling work including a sealing work, reduce the inspection cost, and thereby reduce the semiconductor device manufacturing cost.

It is another object of the present invention to provide a semiconductor device in which a heat sink is difficult to warp.

The above and other objects and novel features of the present invention will become apparent from the following description and the accompanying drawings.

Typical inventions disclosed herein will be outlined below.

(1) A semiconductor device comprising:

a heat sink formed of a flat metallic plate having a high thermal conductivity;

a pair of screwing pieces having respective inner end portions connected with screws respectively to right and left ends of the heat sink on a main surface side of the heat sink, the screwing pieces further having outer end portions formed with through spaces for screwing;

one or plural semiconductor chips fixed to the main surface of the heat sink;

a seal member formed of an insulating resin, the seal member covering a back side opposite to the main surface of the heat sink and also covering the other portions of the two screwing pieces than the outer end portions;

a first lead having an outer end portion projecting from the seal member and further having an inner end portion which is positioned within the seal member and whose inner end is arranged near one side face of the heat sink;

a second lead having an outer end portion projecting from the seal member and further having an inner end portion positioned within the seal member and near another side face of the heat sink; and a plurality of conductive wires for electrically connecting between the leads and predetermined electrodes of the predetermined semiconductor chip, or between the leads and predetermined electrodes of the predetermined semiconductor chip and also between predetermined electrodes of the predetermined semiconductor chip and predetermined electrodes of the predetermined semiconductor chip.

The heat sink is formed using a thick material difficult to deform, while the screwing pieces are formed using a flexible material easy to deform. Each of the screwing pieces is bent in one step at an intermediate portion thereof projecting from the seal member, then extends so that a back side thereof is positioned on a plane on which the back side of the heat sink is positioned, or on a plane close to the plane, the bent portion serving as a buffer portion adapted to deform under a stress. The inner end portions of the first and second leads are formed with engaging portions for engagement with the resin which constitutes the seal member. The first or the second lead is partially provided with a polarity identifying portion. The inner ends of the first and second leads are positioned in regions diverted from the heat sink.

A semiconductor chip with a field effect transistor formed thereon and semiconductor chips with capacitors formed thereon are fixed to the main surface of the heat sink in such a manner that the capacitor-formed semiconductor chips are positioned on both sides in the gate-drain direction of the FET-formed semiconductor chip. A drain electrode formed on an upper surface of the field effect transistor and an upper electrode of one of the semiconductor chips with capacitors formed thereon are connected with each other through the plural wires, and the upper electrode and the first lead are connected with each other through the plural wires. Further, a gate electrode formed on the upper surface of the field effect transistor and an upper electrode of the other capacitor semiconductor chip are connected with each other through the plural wires, and the upper electrode and the second lead are connected with each other through the plural wires. In this way there is constituted a high frequency power amplifier for a base station.

Such a semiconductor device is manufactured through the steps of:

providing a lead frame and a heat sink, the lead frame being constituted by a metallic plate having one or more product forming portions of a predetermined pattern, the heat sink being constituted by a flat metallic plate of a high thermal conductivity which is fixed to the product forming portions with screws;

fixing one or plural semiconductor chips to a main surface of the heat sink;

superimposing the heat sink on back sides of the product forming portions of the lead frame and fixing the heat sink to the lead frame with screws from a main surface side of the lead frame;

connecting between electrodes of the semiconductor chips and inner end portions of corresponding leads and also between predetermined electrodes of predetermined semiconductor chips, using conductive wires;

covering the main surface side of the heat sink and a predetermined portion of the lead frame with an insulating resin by one-side transfer molding to form an insulating seal member; and cutting off an unnecessary portion of the lead frame, allowing a back side of the heat sink which is insulative to be exposed to a back side of the seal member and allowing the leads to be projected from side faces of the seal member, the product forming portion each comprising:

a pair of screwing pieces having respective inner end portions connected with screws respectively to right and left ends of the heat sink on the main surface side of the heat sink, the screwing pieces further having respective outer end portions projecting to the exterior of the seal member, the outer end portions having respective through spaces for screwing which are used at the time of mounting the semiconductor device;

a first lead having an inner end portion which is positioned within the seal member and whose inner end is arranged near one side face of the heat sink and further having an outer end portion projecting from the seal member; and a second lead having an inner end portion positioned within the seal member and near another side face of the heat sink and further having an outer end portion projecting from the seal member, wherein in the step of cutting off the unnecessary portion of the lead frame, or thereafter, the leads projecting from the side faces of the seal member are bent in one step to form surface-mounted type leads.

In the above semiconductor device manufacturing method, the screwing pieces are cut so that there remain the through spaces for screwing, and the screwing pieces are bent in one step at intermediate portions thereof projecting from the seal member, then extend so that back sides thereof are each positioned on a plane on which the back side of the heat sink is positioned or on a plane close to the plane.

BRIEF DESCRIPTION OF THE DRAWINGS

FIG. 17 is a schematic diagram showing in what state the semiconductor device of the first embodiment is manufactured as a device not equipped with suspension leads by cutting the lead frame selectively;

DETAILED DESCRIPTION OF THE PREFERRED EMBODIMENTS

Figure 1:
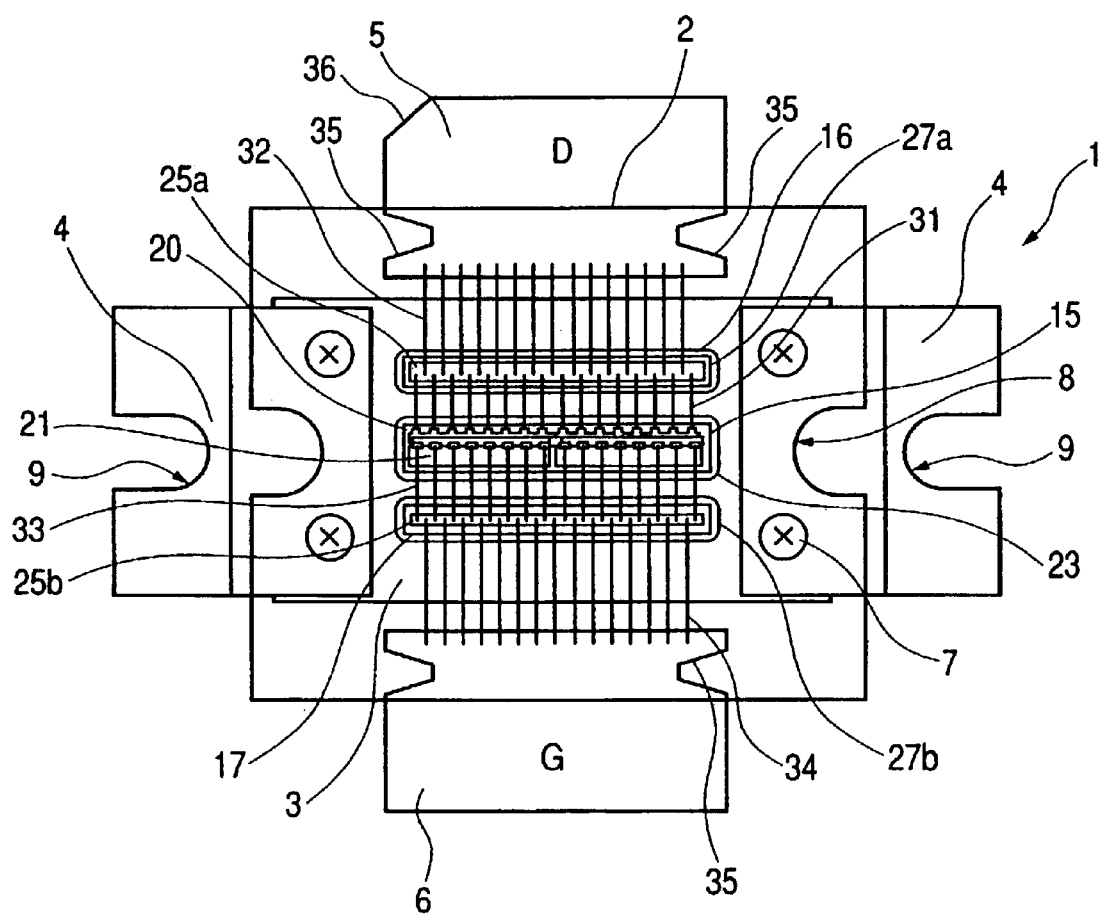
FIG. 1 is a perspective plan view showing the structure of a semiconductor device according to an embodiment (first embodiment) of the present invention.

Embodiments of the present invention will be described in detail hereinunder with reference to the accompanying drawings. In all of the drawings for illustrating the embodiments, portions having the same functions are identified by like reference numerals, and repeated explanations thereof will be omitted.

First Embodiment

FIGS. 1 to 18 are concerned with a semiconductor device according to an embodiment (first embodiment) of the present invention, of which FIGS. 1 to 7 are concerned with the structure of the semiconductor device and FIGS. 8 to 17 are concerned with the manufacture of the semiconductor device. In this first embodiment, a description will be given below about an example in which the present invention is applied to a high frequency power amplifier (a high frequency power amplifier module) for a base station, as a semiconductor device.

Figure 2:
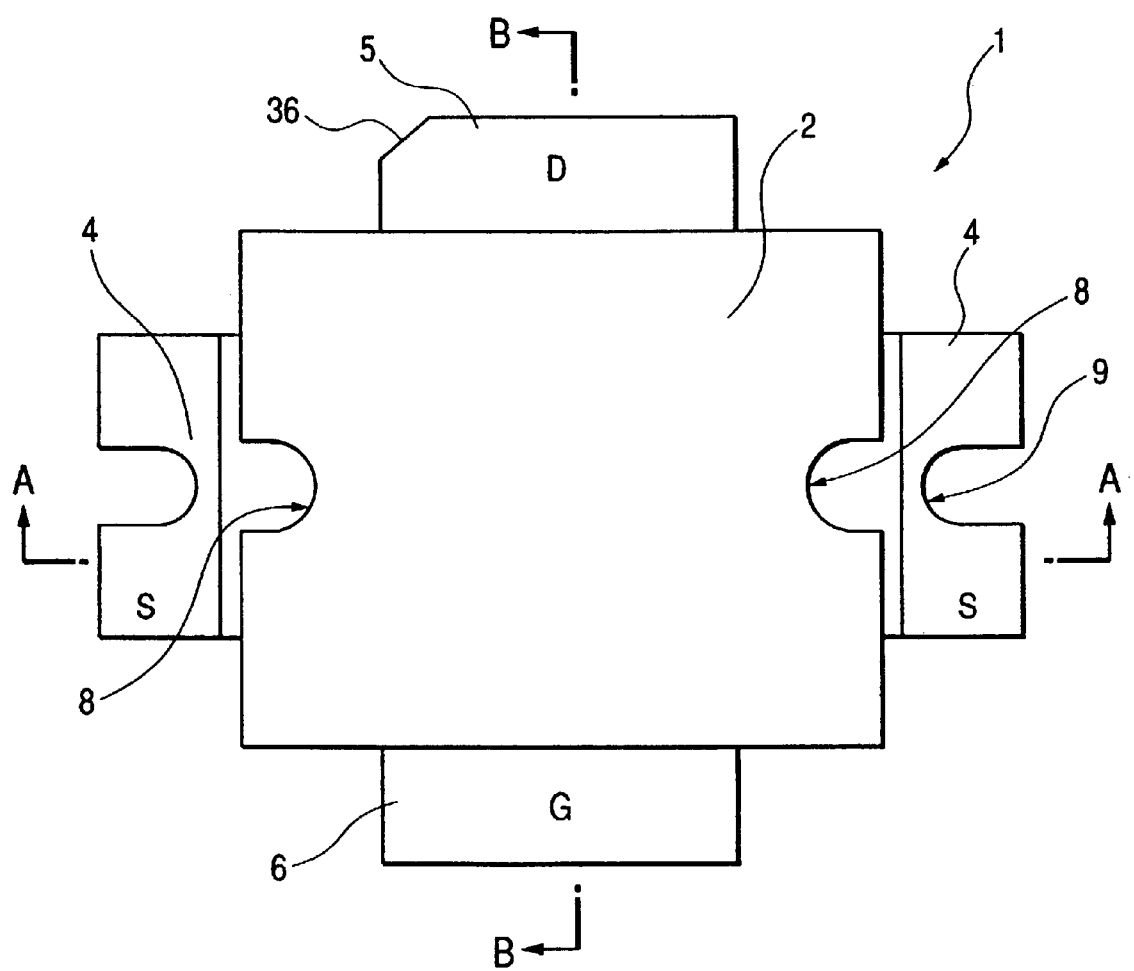
FIG. 2 is a plan view thereof.
Figure 3:
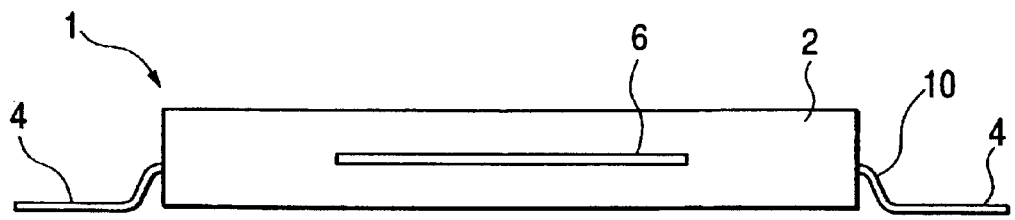
FIG. 3 is a front view thereof.
Figure 4:
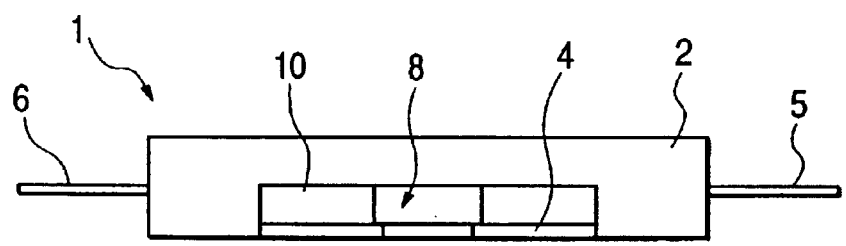
FIG. 4 is a side view thereof.
Figure 5:
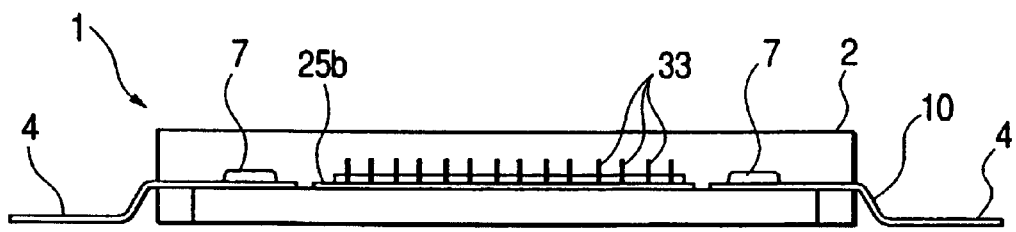
FIG. 5 is a schematic sectional view taken along line A—A in FIG. 2.
Figure 6:
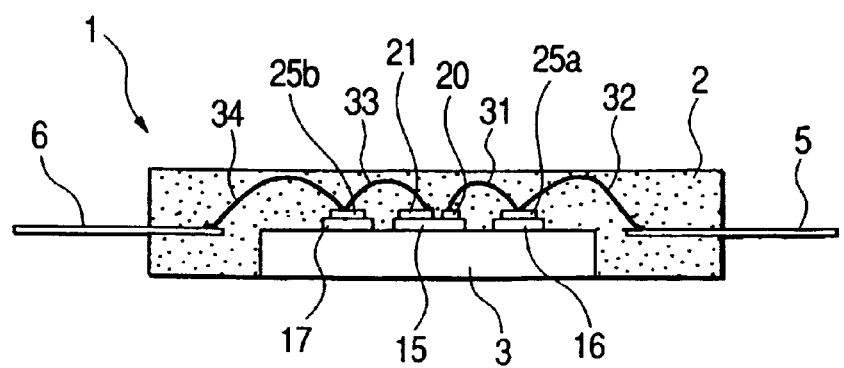
FIG. 6 is a schematic sectional view taken along line B—B in FIG. 2.
Figure 7:
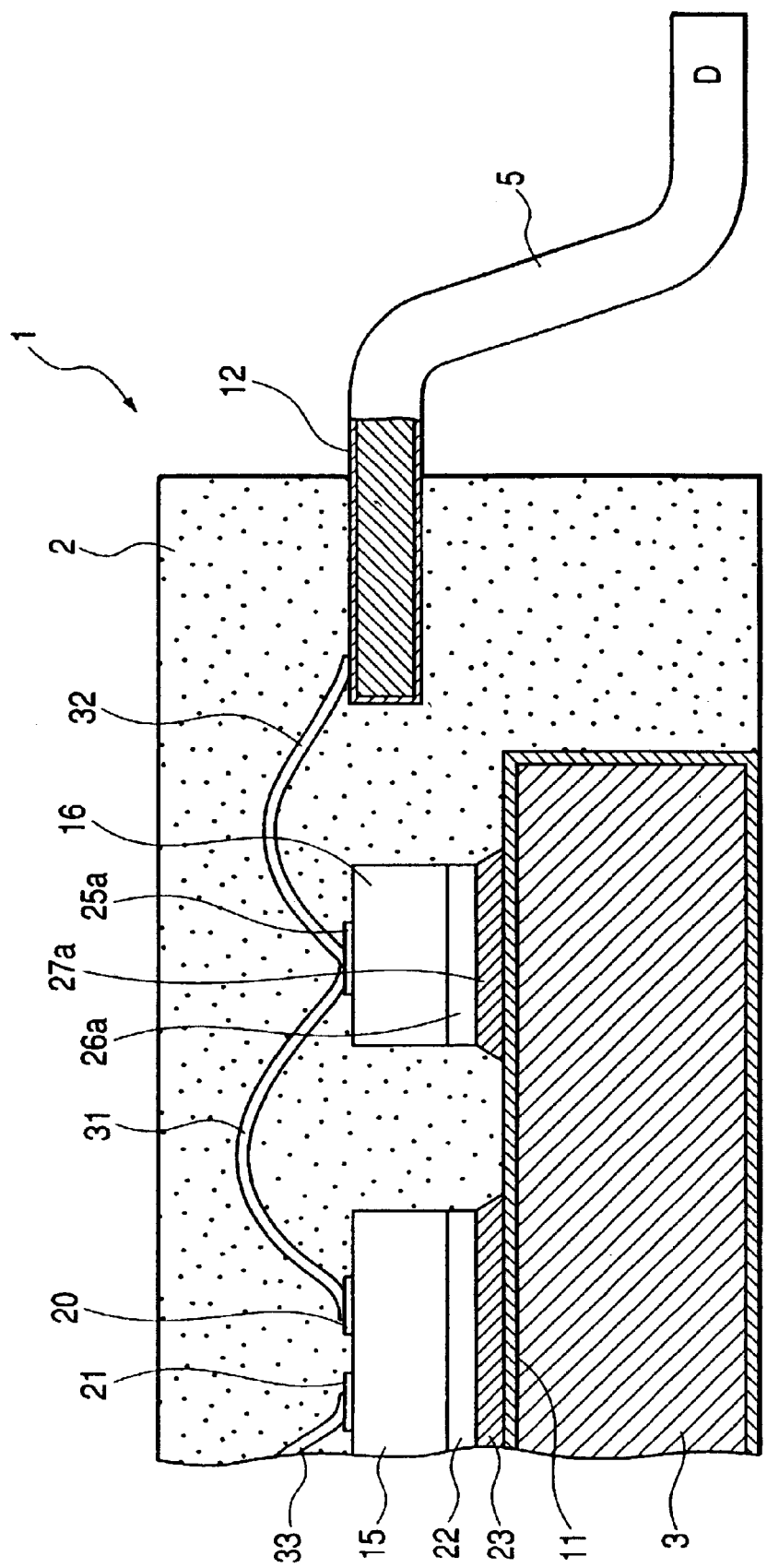
FIG. 7 is an enlarged sectional view showing a part of the semiconductor device of the first embodiment.

The semiconductor device of this first embodiment, i.e., a high frequency power amplifier module for a base station, indicated at 1, has such a structure as shown in FIGS. 1 to 7, of which FIG. 1 is a perspective plan view, FIG. 2 is a plan view, FIG. 3 is a front view, FIG. 4 is a side view, FIGS. 5 and 6 are schematic sectional views taken along lines A—A and B—B in FIG. 2, and FIG. 7 is a partially enlarged sectional view.

In appearance, as shown in FIGS. 2 to 4, the semiconductor device 1 of this embodiment comprises a flat, rectangular, seal member (package) 2 formed of an insulating resin, a heat sink (substrate) 3 whose lower surface is exposed to a bottom of the seal member 2, a pair of screwing pieces (suspension leads) 4 projecting respectively from both ends (short sides) in the longitudinal direction of the seal member 2, a first broad lead 5 and a second broad lead 6 projecting respectively from long sides of the seal member 2. The second lead 6 serves as a gate (G) lead. The lower surface of the heat sink 3 exposed to the bottom of the seal member 2 serves as both a heat radiating surface and a source electrode.

The seal member 2 is formed, for example, using an insulating epoxy resin by transfer molding. The seal member 2 has a structure which covers the four side faces of the heat sink 3 and in which a water admission path passing the interface between the heat sink 3 and the resin is made long to ensure a high reliability. Recesses 8 are formed centrally of short sides of the seal member 2 and toward the center of the seal member. The recesses 8 are draw-out traces of an upper mold for clamping the heat sink 3 and the screwing pieces 4 with upper and lower molds of a molding die and causing the heat sink 3 to come into close contact with the lower mold positively in transfer molding to prevent the occurrence of burrs caused by flowing-out of resin.

The heat sink 3 and the screwing pieces 4 are formed of metal, and within the seal member 2, an inner end portion of each screwing piece 4 is superimposed on an upper surface of the heat sink 3 and is connected thereto with two screws 7 (see FIG. 1), so that the heat sink 3 and the screwing pieces 4 become equal in potential and can be used as source (S) terminals. Semiconductor chips are fixed to the heat sink 3 and the heat sink plays the role of dissipating the heat generated in the semiconductor chips, therefore, the heat sink 3 is formed of a flat metallic plate (e.g., CuMo plate) superior in thermal conductivity. Besides, the heat sink 3 is as thick as 2 mm for example to make its deformation difficult. On the other hand, the screwing pieces 4 are as thin as 0.15 mm for example and are flexible so as to serve as suspension leads.

Both screwing pieces 4 have screwing grooves 9 formed in respective outer end portions. With use of the paired screwing grooves 9 the semiconductor device 1 is fixed with screws to a mounting substrate such as a mother board. The inner end portions of the screwing pieces 4 are superimposed and fixed onto the main surface (upper surface) of the heat sink 3, and the outer end portions of the screwing pieces 4 are mounted in contact with the mounting substrate. Therefore, as shown in FIG. 5, the screwing pieces 4 are bent in one step at their portions projecting from the seal member 2. The bent portions, indicated at 10, are easily deformable portions against a stress, i.e., suspension portions.

As shown in FIG. 7, a plating film 11 is formed on the whole surface of the heat sink 3. The plating film 11 comprises Ni plating film as undercoat and Au plating film formed on the Ni plating film. The Ni plating film is superior in its adhesion to CuMo which constitutes the heat sink 3. The Au plating film is formed as thick as about 3 μm so that it can withstand heat of a high temperature which is generated at the time of fixing semiconductor chips to the heat sink 3 by AuSi eutectic.

Each screwing piece 4 also has a plating film 12 formed on its surface. The screwing piece 4 is formed of an FeNi-base metal such as Kovar or 42 alloy. The plating film 12 comprises Ni plating film as undercoat and Au plating film formed on the Ni plating film. The Ni plating film is superior in its adhesion to the FeNi-base metal. The Au plating film is formed for improving the bondability of aluminum (Al) wire, but its thickness may be as small as 0.2 μm or so.

As shown in FIGS. 1 and 5 to 7, three semiconductor chips 15, 16, and 17 are fixed to the main surface portion of the heat sink 3 located between the pair of screwing pieces 4. The semiconductor chips 15, 16, and 17 are elongated in shape and with electrodes extending along their long sides. All the semiconductor chips 15, 16, and 17 extend along the long sides of the heat sink 3. The long sides of the seal member 2 and those of the heat sink 3 extend in the same direction and are opposed to each other.

A field effect transistor (MOSFET) is incorporated in the semiconductor chip 15. As shown in FIG. 7, out of drain, gate, and source electrodes of MOSFET, a drain electrode 20 and a gate electrode 21 are formed on an upper surface of the semiconductor chip 15, while a source electrode 22 is formed on a lower surface of the chip 15. The drain and gate electrodes are elongated and extend along long sides of the chip in an opposed relation to each other. The source electrode 22 is fixed to the heat sink 3 through an AuSi eutectic layer 23. The AuSi eutectic layer 23 is formed by affixing gold foil to a predetermined portion of the heat sink 3, then pushing the semiconductor chip against the gold foil, followed by heating scrubbing.

The semiconductor chips 16 and 17 are fixed onto the main surface of the heat sink 3 on both sides of the semiconductor chip 15 spacedly a predetermined distance from the chip 15. The semiconductor chips 16 and 17 have a structure in which capacitors are incorporated. As shown in FIGS. 6 and 7, one upper electrodes 25*a* and 25*b* are formed on upper surfaces of the semiconductor chips 16 and 17 respectively, while other lower electrodes 26*a* and 26*b* are formed on lower surfaces of the semiconductor chips 16 and 17 respectively. The lower electrodes 26*a* and 26*b* of the semiconductor chips 16 and 17 are fixed to the heat sink 3 through AuSi eutectic layers 27*a* and 27*b* respectively. As is the case with the semiconductor chip 15, the AuSi eutectic layers 27*a* and 27*b* are formed by affixing gold foil to predetermined portions of the heat sink 3 and thereafter pushing the semiconductor chips against the heat sink 3, followed by scrubbing under heating. As a result, the semiconductor chips 16 and 17 are fixed to the heat sink 3.

The drain lead 5 and the gate lead 6 have a broad structure so as to stand face to face with the elongated semiconductor chips 15, 16, and 17. The drain electrode 20 of the semiconductor chip 15 and the upper electrode 25*a* of the semiconductor chip 16 located close to the drain lead 5 are electrically connected with each other through a conductive wire 31. Further, the upper electrode 25*a* and the drain lead 5 are electrically connected with each other through a conductive wire 32. Likewise, the gate electrode 21 of the semiconductor chip 15 and the upper electrode 25*b* (see FIG. 1) of the semiconductor chip 16 located close to the gate lead 6 are electrically connected with each other through a conductive wire 33. Further, the upper electrode 25*b* and the gate lead 6 are electrically connected with each other through a conductive wire 34.

Figure 32:
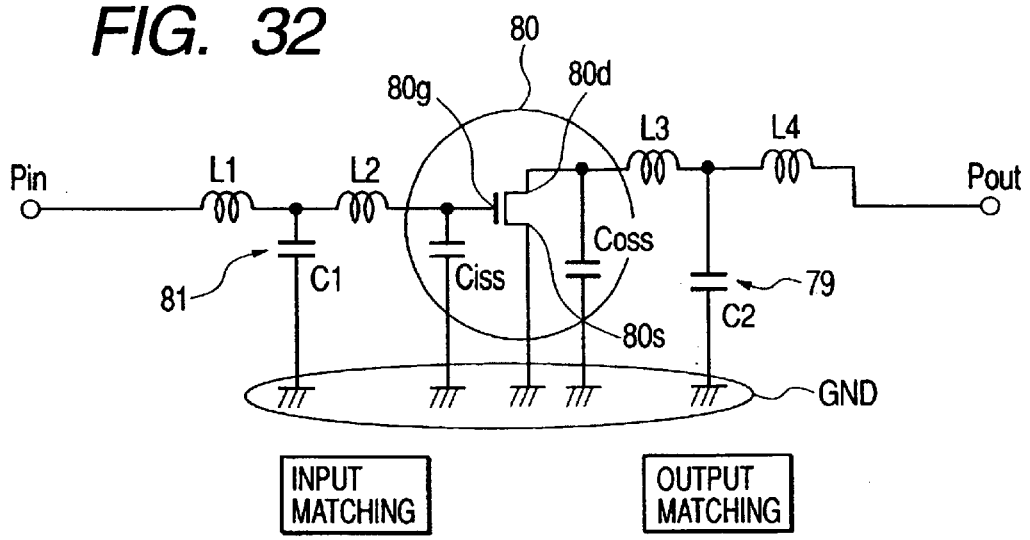
FIG. 32 is an equivalent circuit diagram thereof.
Figure 33:
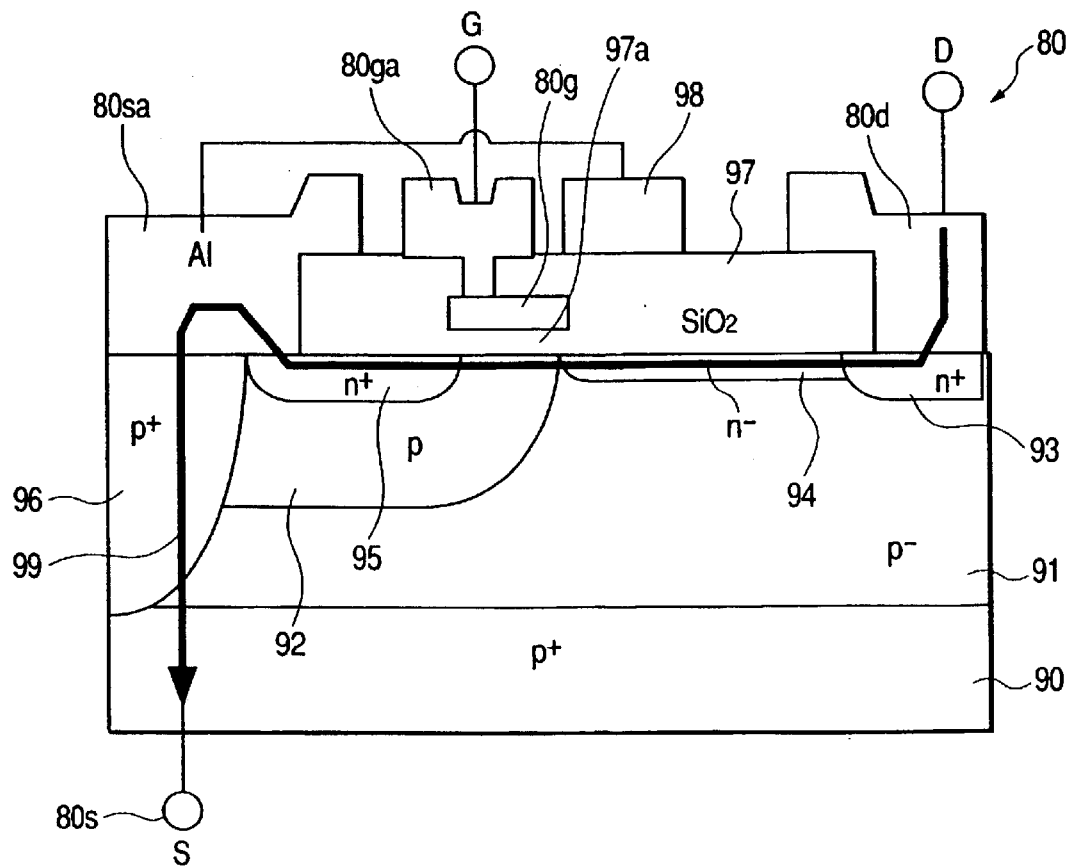
FIG. 33 is a schematic sectional view of an FET chip used in the studied semiconductor device.

As to the wires for connection between electrodes or between electrodes and leads, as shown in FIG. 1, plural wires of connections can be effected because the wire connections are parallel to one another and extend long. By this plural-wire connection it is possible to ensure desired current capacity and high frequency characteristics (e.g., drain efficiency and gain). As the wires there are used aluminum wires. The aluminum wires are each in the form of a wire loop so as to afford an appropriate inductance for a desired frequency characteristic and permit the formation of a desired internal circuit, whereby there is formed a high frequency power amplifier module constituted by the equivalent circuit shown in FIG. 32.

As shown in FIG. 1, each lead portion positioned within the seal member 2 is provided with engaging portions 35 on both sides of the lead for engagement with the resin which constitutes the seal member. This is for preventing easy release of the leads 5 and 6 from the seal member 2. Further, a corner portion of an outer end of the drain lead 5 is cut off obliquely to form a polarity identifying portion 36 so that the polarity of the electrode can be identified visually. The shape and structure of the polarity identifying portion 36 may be other shape and structure.

The leads 5 and 6 and the screwing pieces (suspension leads) 4 are formed by cutting a single lead frame in the manufacture of the semiconductor device. Therefore, the composition, thickness and surface treatment are common to them.

Next, with reference to FIGS. 8 to 17, the following description is provided about the method of manufacturing the semiconductor device according to the first embodiment. In this first embodiment there are used a lead frame 40 shown in FIG. 8 and a heat sink (substrate) 3 shown in FIGS. 9 and 10.

The lead frame 40 is formed into a predetermined pattern by etching a metallic plate about 0.15 mm in thickness or by punching the plate with a precision press. The lead frame 40 used in this embodiment is of a multi-arrangement structure in which plural product forming portions 41 each for the formation of one product are arranged in a row. In this embodiment the number of the product forming portions 41 is five. The metallic plate is formed using an FE—Ni-base alloy such as Kovar or 42 alloy to match the heat sink 3 in expansion coefficient. On one side of the lead frame 40 are formed guide holes 43 to be used for conveyance or positioning of the lead frame. The guide holes 43 are positioned in opposition to the product forming portions 41 respectively.

Figure 8:
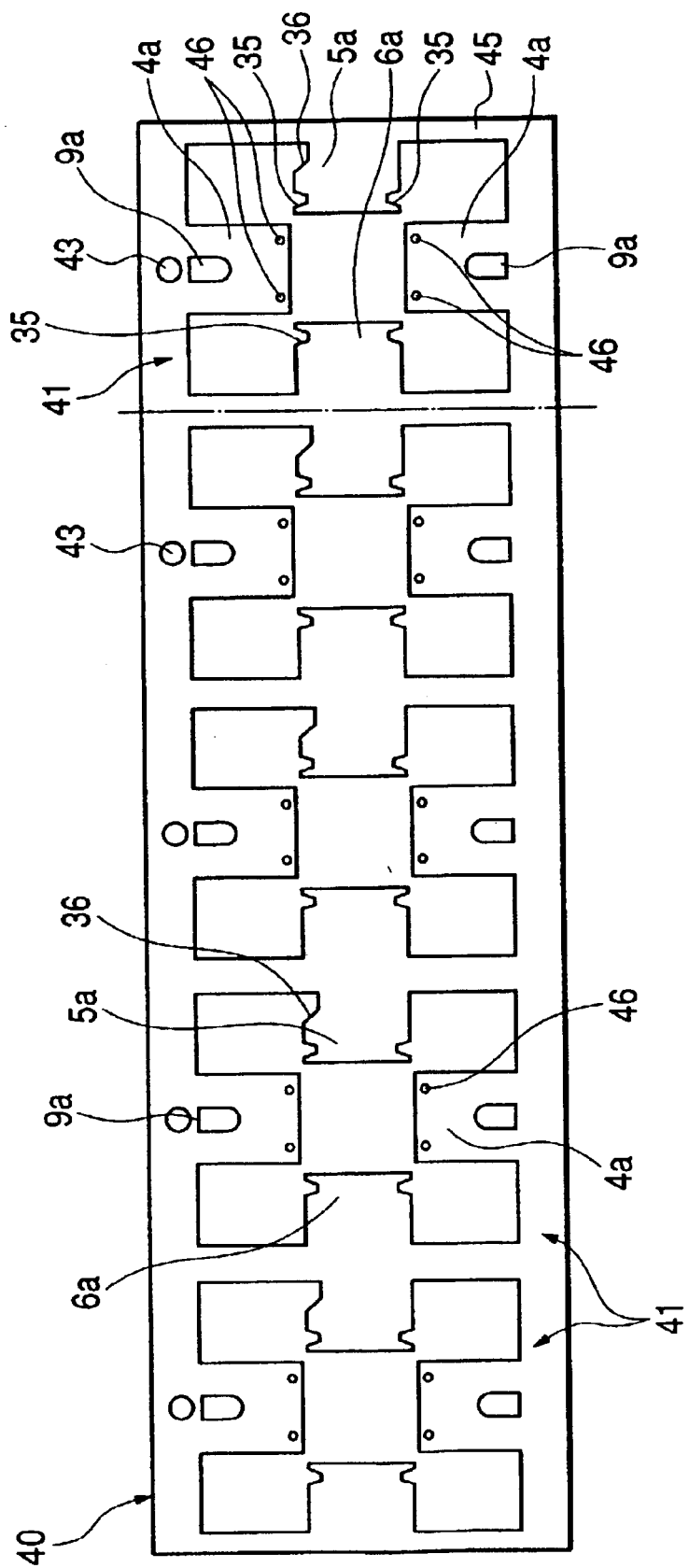
FIG. 8 is a plan view of a lead frame used in manufacturing the semiconductor device of the first embodiment.

As shown on the right end side of FIG. 8, each product forming portion 41 has a quadrangular frame 45, a pair of cantilevered screwing pieces 4*a* projecting inwards from central portions of a pair of opposed sides of the frame 45, and cantilevered leads 5*a* and 6*a* projecting inwards from central portions of the remaining pair of opposed sides. At a base portion of the frame 45 one side edge of the lead 5*a* is thinned obliquely to form a polarity identifying portion 36. In a subsequent step of cutting the lead 5*a* the polarity identifying portion 36 is cut halfway thereof to form a polarity identifying portion 36 at a tip corner portion of the lead 5.

Ni plating film is formed on the whole surface of the lead frame 40 and Au plating film is formed at least on surfaces of the screwing pieces 4*a* and the leads 5*a*, 6*a*. Ni plating film is high in its adhesion to both Fe—Ni alloy and Au plating. In this first embodiment it suffices for the Au plating film to be as thin as 0.2 μm for example because it is only the connection of Al wires to the leads 5a and 6a that is required. The material cost is reduced by thinning the Au plating film.

All of the screwing pieces 4a and the leads 5a, 6a are eventually cut into screwing pieces 4 and leads 5, 6 at positions near base positions of the frame 45. Therefore, in each screwing piece 4a is formed a hole 9a by a pattern which partially overlaps a screwing groove 9 so that the groove 9 is formed upon formation of the screwing piece 4. Further, recessed engaging portions 35 are formed on both sides of an inner end portion of each of the leads 5a and 6a.

Figure 9:
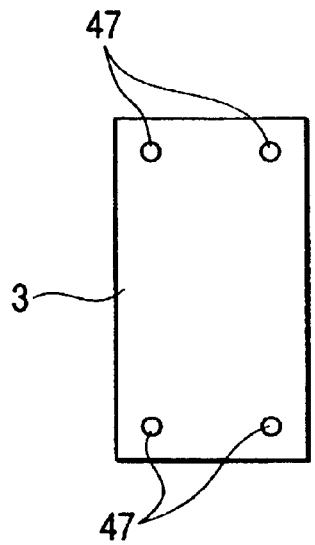
FIG. 9 is a plan view of a substrate used in manufacturing the semiconductor device of the first embodiment.
Figure 10:
FIG. 10 is a side view thereof.

A square space is present centrally of each product forming portion 41. The heat sink (substrate) 3 comes to be positioned in the space. Screws are used in this embodiment for fixing the heat sink 3. Therefore, guide holes 46 for insertion therein of the screws are formed in both side edge portions on an inner-end side of each screwing piece 4. FIGS. 9 and 10 show a rectangular heat sink 3, with tapped holes 47 being formed in the four corners of the heat sink correspondingly to the guide holes 46. Means for fixing the heat sink 3 is not limited to the use of screws. There may be adopted welding, soldering, or riveting.

Semiconductor chips are fixed to the heat sink 3. The semiconductor chips are each formed on a fragile silicon board, so for the prevention of damage to each semiconductor chip, it is required that the heat sink 3 be high in rigidity. It is also required for the heat sink 3 to be high in thermal conductivity because it also plays the role of dissipating the heat generated in the semiconductor chips to the exterior promptly. For this reason, the heat sink 3 is formed using such a metallic material as is highly compatible in thermal expansion coefficient with the semiconductor chips formed of silicon and superior in heat radiating property. For example, the heat sink 3 is formed of a flat CuMo plate about 2 mm thick. Ni plating film high in adhesion to CuMo is formed on the surface of the heat sink 3 and Au plating film is formed on the Ni plating film. The Au plating film is as thick as 3 μm or so. This is for making the semiconductor chips resistive to a high-temperature heat at the time of chip bonding for fixing the chips to the heat sink 3 by AuSi eutectic.

Figure 11A:
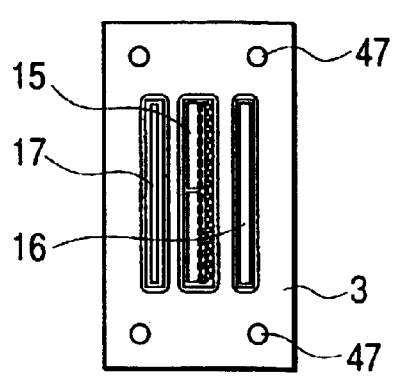
FIGS. 11(*a*) and 11(*b*) illustrate the substrate with semiconductor chips fixed thereto in the manufacture of the semiconductor device of the first embodiment.
Figure 11B:
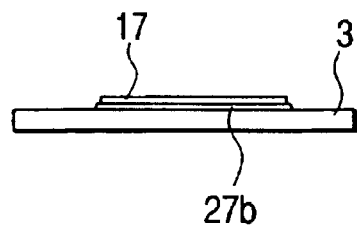

At the beginning of the assembling work in this first embodiment, as shown in FIGS. 11(a) and 11(b), three semiconductor chips 15, 16, and 17 are fixed to the main surface of the heat sink 3 by AuSi eutectic layer. This fixing operation can be done easily by affixing gold foil to predetermined portions of the heat sink, then pushing the semiconductor chips against the gold foil, followed by scrubbing under heating (430° C. for example). In this way the semiconductor chip 15 with MOSFET formed thereon is fixed centrally and the semiconductor chips 16 and 17 with capacitors formed thereon are fixed on both sides of the chip 15 (see FIGS. 6 and 7).

Figure 34:
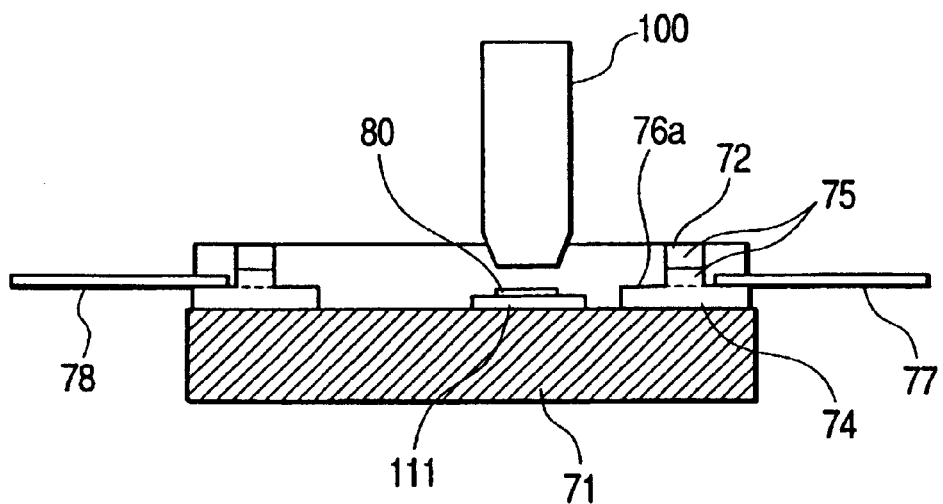
FIG. 34 is a schematic diagram showing a state of chip bonding in the manufacture of the studied semiconductor device.
Figure 35:
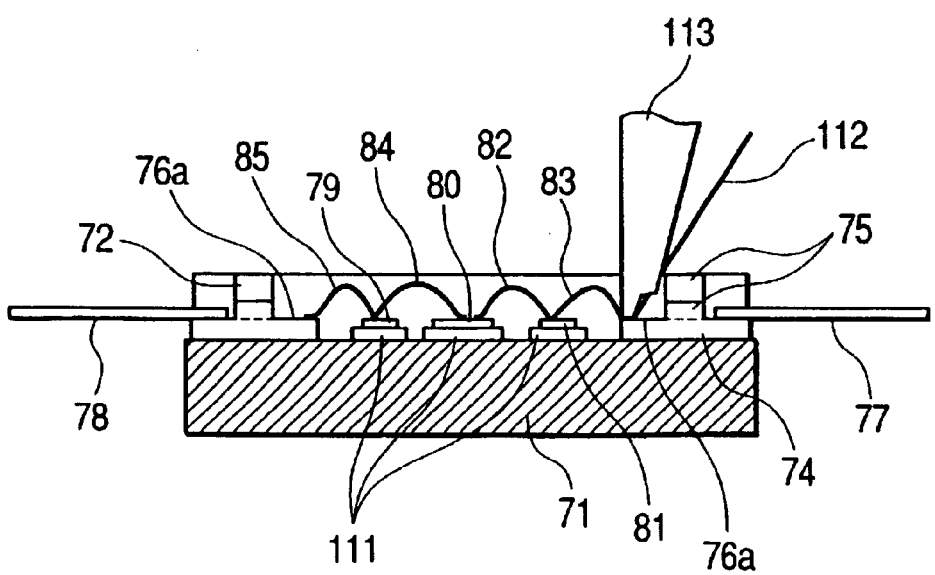
FIG. 35 is a schematic diagram showing a state of wire bonding in the manufacture of the studied semiconductor device.
Figure 36:
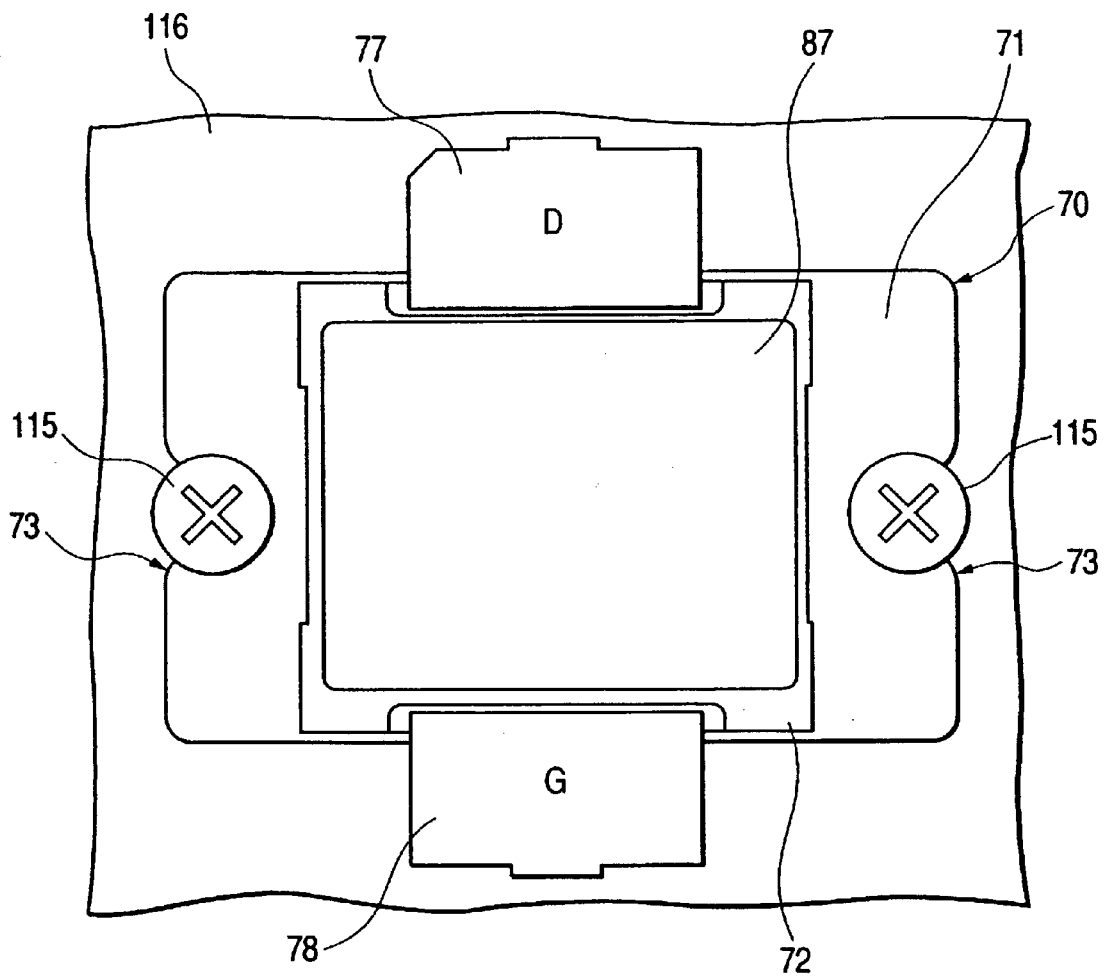
FIG. 36 is a plan view of the studied semiconductor device as screwed to a set radiation board.
Figure 37:
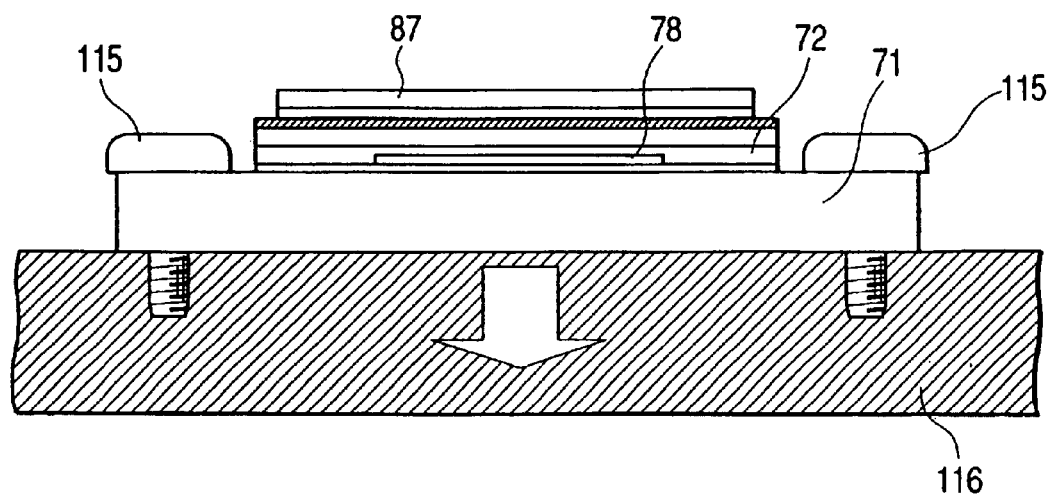
FIG. 37 is a schematic sectional view thereof.
Figure 38A:
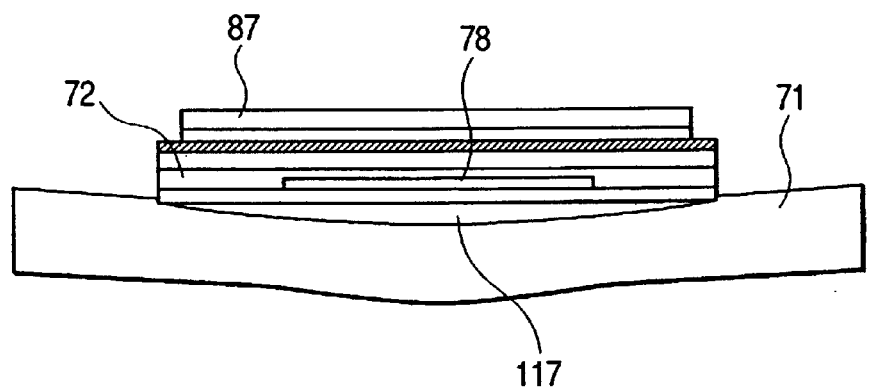
FIGS. 38(a) and 38(b) are schematic diagrams showing a mounted state of the studied semiconductor device in which a substrate is warped in a centrally depressed state.
Figure 38B:
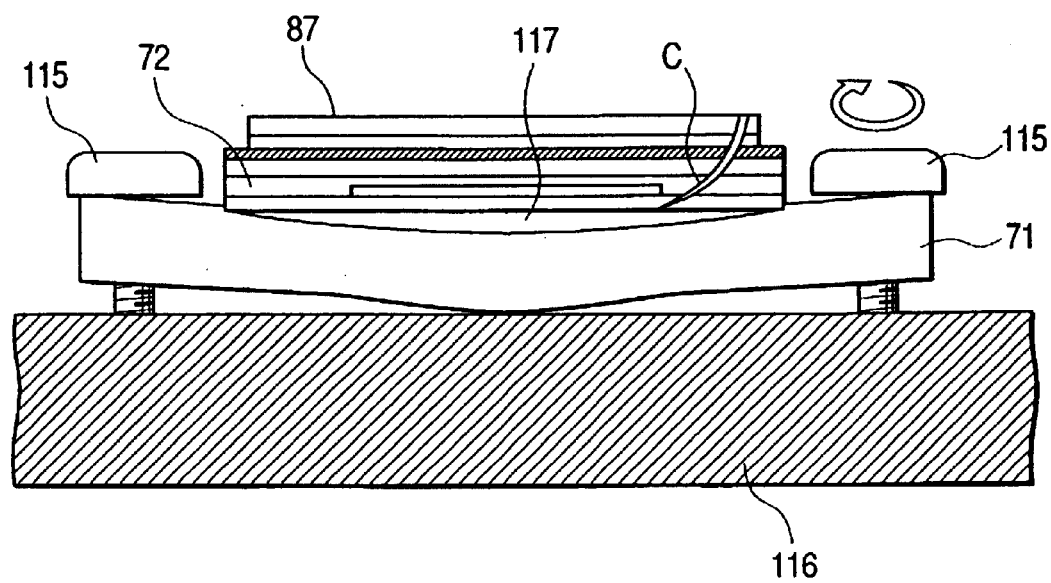
Figure 39A:
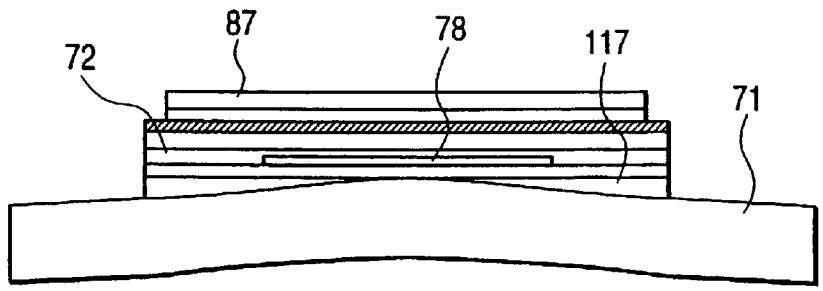
FIGS. 39(a) to 39(c) are schematic diagrams showing a mounted state of the studied semiconductor device in which a substrate is warped in a centrally raised state.
Figure 39B:
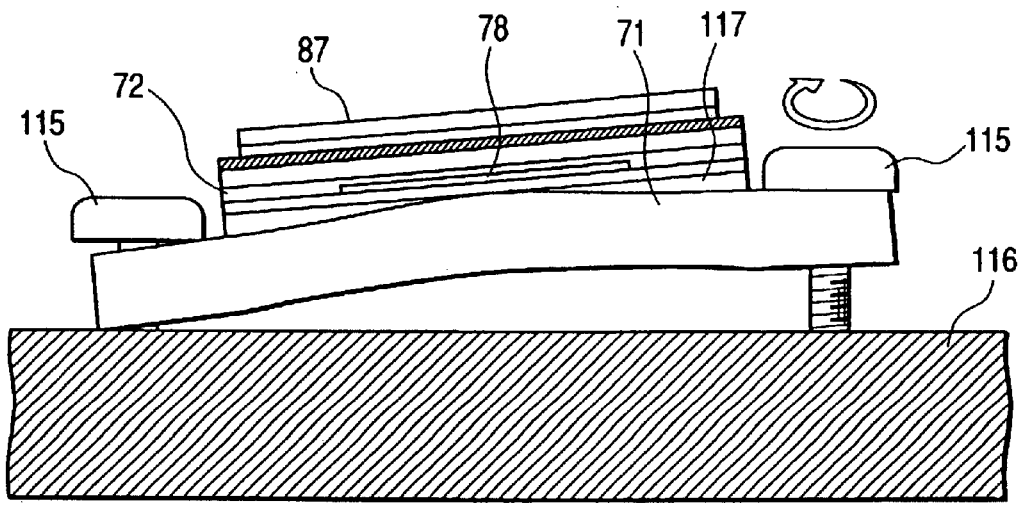
Figure 39C:
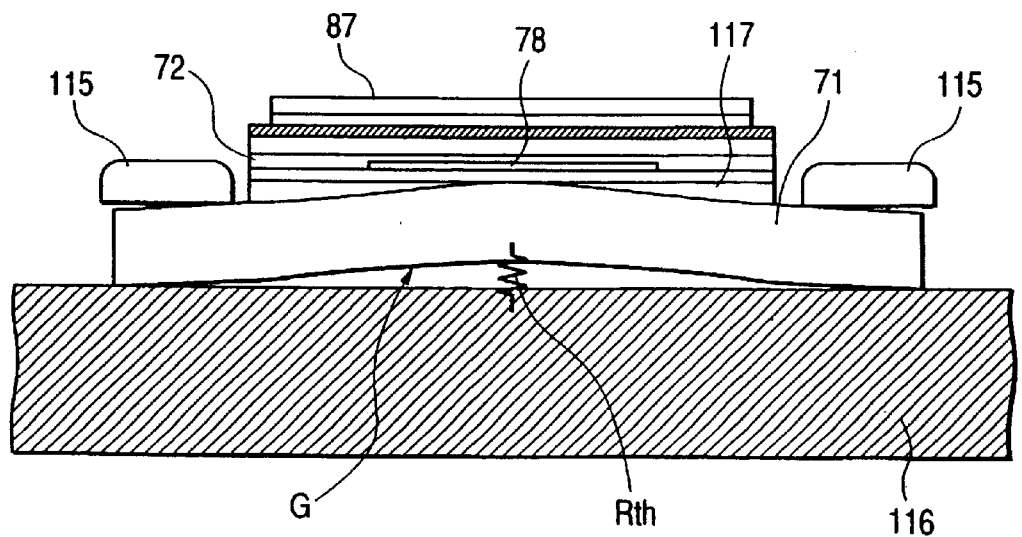

This chip bonding work is performed by means of a chip bonding apparatus (not shown). Handling of each semiconductor chip is conducted using a tool called collet. The heat sink 3 is a flat plate having a flat main surface. Thus, unlike the heat sink 71 shown in FIG. 34, any obstacle, including the frame 72, is not present on the main surface, so there is no fear of the collet striking against any obstacle even when it is scrubbed, thus permitting bonding for any portion of the main surface of the heat sink 3. This leads to reduction of the bonding margin and hence reduction in size of the heat sink 3.

Figure 12:
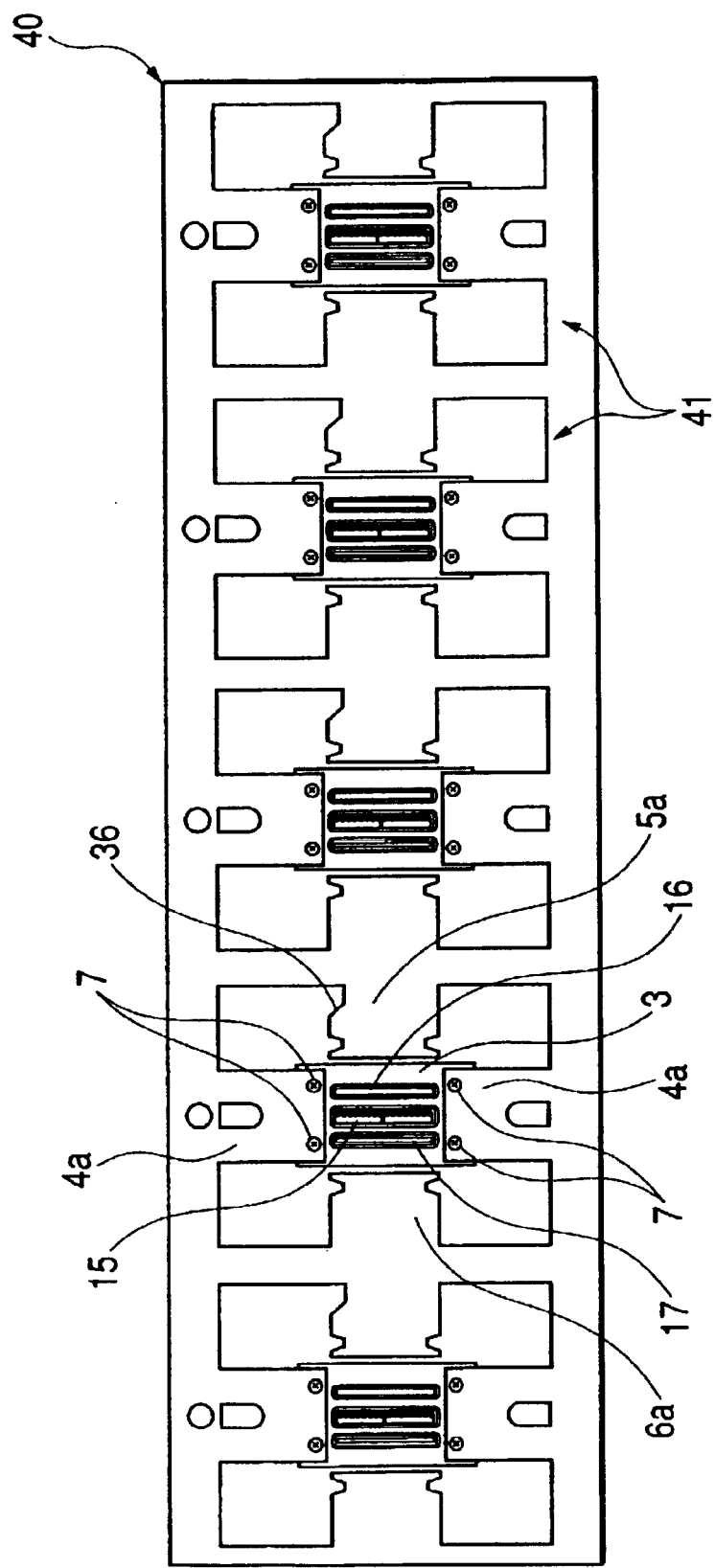
FIG. 12 is a plan view of the lead frame with the substrate attached thereto.

Next, the heat sink 3 is fixed to the lead frame 40, as shown in FIG. 12. More specifically, the main surface of the heat sink 3 is positioned and superimposed on the back side of the lead frame 40, then screws 7 are inserted into the guide holes 46 formed in the lead frame 40 and their tips are threaded into the tapped holes 47 of the heat sink 3, whereby the heat sink is fixed to the lead frame 40. At this stage, the discrete members are assembled into a continuous frame shape, thus permitting easy handling and permitting subsequent works to be done in high efficiency and accurately.

Figure 13:
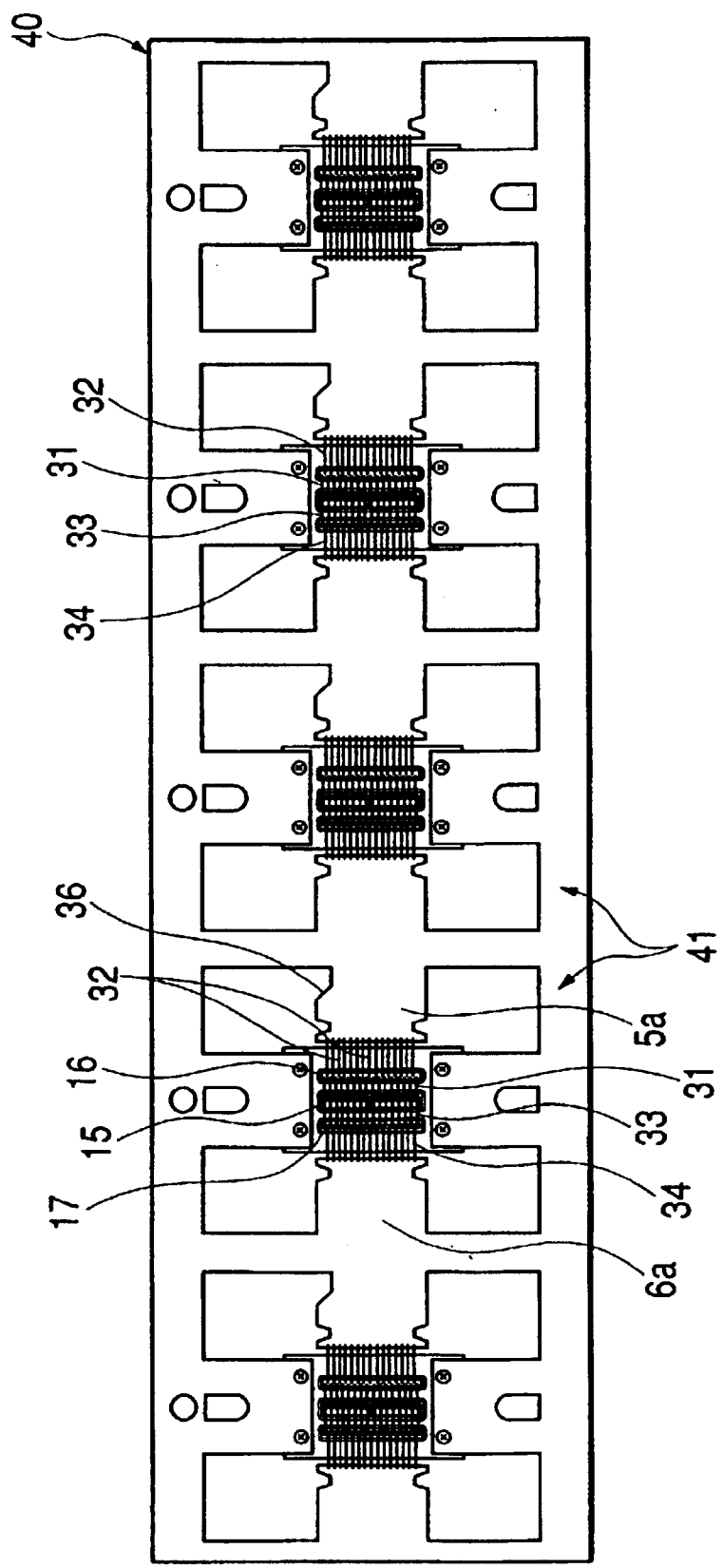
FIG. 13 is a plan view of the lead frame after the end of wire bonding in the manufacture of the semiconductor device of the first embodiment.
Figure 14:
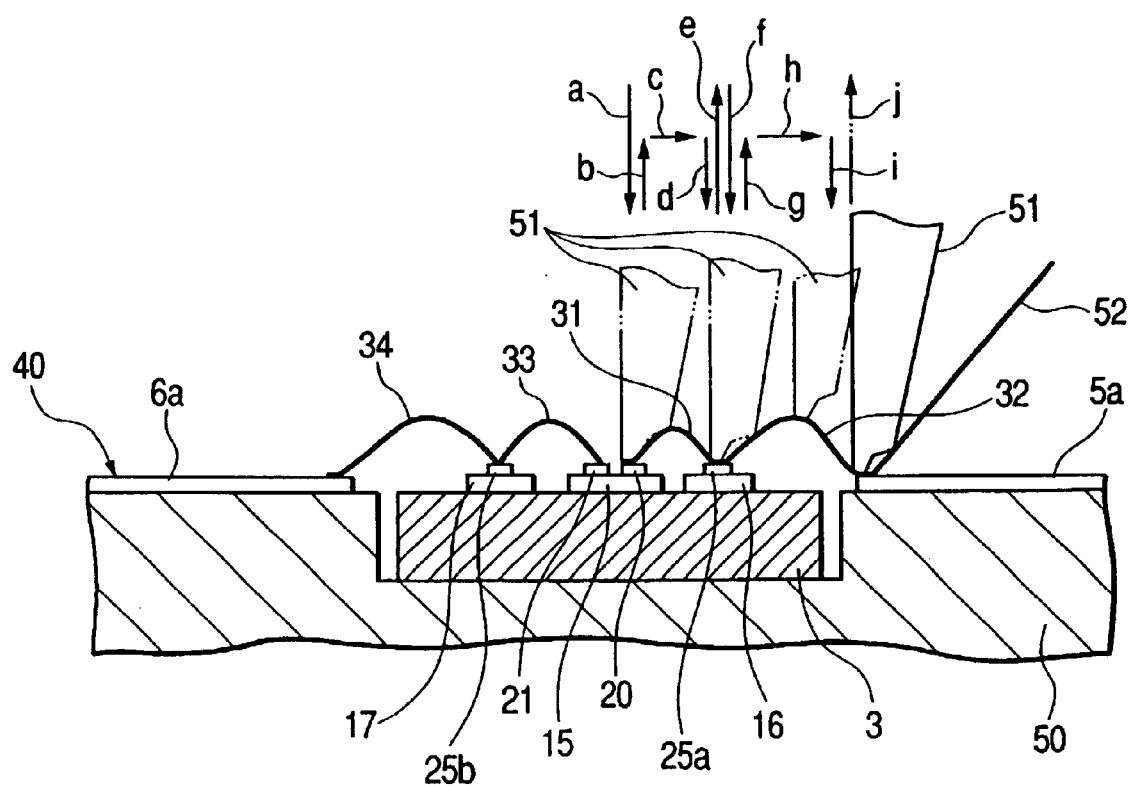
FIG. 14 is a schematic diagram showing how to perform the wire bonding.

Next, wire bonding is conducted as shown in FIGS. 13 and 14. The wire bonding is carried out by means of an ultrasonic wire bonder using Al wire. More specifically, as shown in FIG. 14, the lead frame 40 with the heat sink 3 secured thereto is put on a stage 50 of the ultrasonic wire bonder and then a wire 52 held by a bonding tool 51 is connected by scrubbing induced by ultrasonic oscillation of the bonding tool 51. For example, the drain electrode 20 of the semiconductor chip 15 on the heat sink 3 and the upper electrode 25a on the semiconductor chip 16 are connected with each other through wires 31, while the upper electrode 25a and the lead 5a are connected with each other through wires 32.

Connection of the wires 31 and 32 is performed as indicated with arrows a to j in FIG. 14. To be more specific, the bonding tool 51 moves down like arrow a while holding the wire 52 with use of a clamper, pushes the tip of the wire 52 against the drain electrode 20, then oscillates for connection (first bonding), thereafter moves upward, horizontally and then downward like arrows b, c, d, to connect an intermediate portion of the wire 52 to the upper electrode 25a on the semiconductor chip 16 (second bonding). During such ascent, horizontal movement, and descent of the bonding tool 51, the damper opens and the wire 52 is drawn out successively from the tip of the bonding tool 51, so that the wire 31 is connected while describing a desired loop.

After the second bonding, the bonding tool 51 rises like arrow e, but the damper holds the wire 52 during this upward movement. As a result, the wire 52 is pulled and breaks at a position near the connection (second bonding portion) with the upper electrode 25a.

Next, the bonding tool 51 moves like arrows f to j to effect connection of the wire 32 in which the upper electrode 25a on the semiconductor chip 16 is the first bonding portion and the tip of the lead 5a is the second bonding portion. As a result, the drain electrode 20 on the semiconductor chip 15 is connected to the lead 5a electrically.

Next, the stage 50 is turned 180°, then by the same wire bonding method as that described previously the gate electrode 21 of the semiconductor chip 15 and the upper electrode 25b of the semiconductor chip 17 are connected with each other through wires 33, and the upper electrode 25b and the lead 6a are connected with each other through a wire 34, to complete wire bonding. The wires 31 to 34 are in such connected states as shown in FIG. 1.

Since the Al wire bonding work can be done at room temperature, the deterioration of the surface plating of the lead frame 40 is difficult to occur. Therefore, even if the Au plating film formed on the surfaces of leads 5a and 6a of the lead frame 40 is as thin as 0.2 μ or so, the problem of deteriorated bondability does not occur. If the Au plating film is as thin as 0.2 μm or so, it is possible to enhance the reliability because an intermetallic compound of AlAu cannot grow. There also accrues an actual advantage that the work for removing Au from the lead surfaces is not needed at the time of mounting performed by a user.

The wire bonding work can be done smoothly because an obstacle such as a frame which interferes with the bonding tool 51 in wire bonding and restricts the movement of the bonding tool is not present on the main surface of the heat sink 3.

Figure 15:
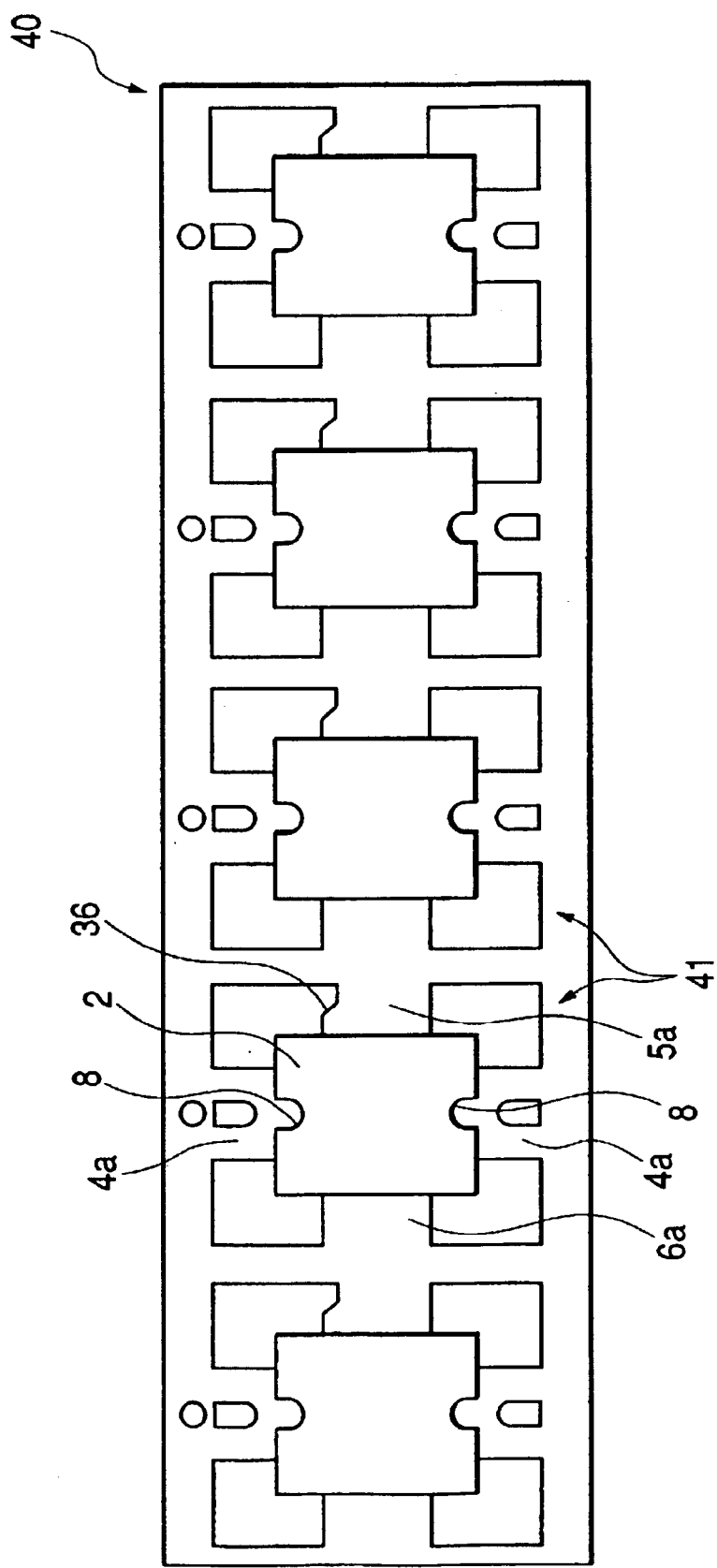
FIG. 15 is a plan view of the lead frame after the end of sealing with resin in the manufacture of the semiconductor device of the first embodiment.

Next, one-side molding is performed by transfer molding. FIG. 15 is a plan view of the lead frame 40 in which the heat sink 3 and the wires 31 to 34 are covered with the seal member 2. As shown in the same figure, a lead 5a projects from one long side of the seal member 2 which is flat and quadrangular in shape, a lead 6a projects from the other long side, and screwing pieces 4a project from short sides respectively. As a matter of course, holes 9a are positioned outside the seal member 2.

In central edge portions of the short sides of the seal member 2 are formed recesses 8 which are depressed toward the center of the seal member. The recesses 8 are draw-out traces of an upper mold of a molding die which pushes the heat sink 3 and the screwing pieces 4a superimposed on the heat sink against a lower mold of the die in transfer molding. With the upper mold which leaves such draw-out traces, the screwing pieces 4a can be brought into close contact with the heat sink 3 and the back side of the heat sink can be put in close contact with the lower mold, whereby it is possible to prevent the leakage of resin.

Next, an unnecessary lead frame portion is removed to manufacture the semiconductor device. In the upper-stage portions of FIGS. 16 and 17, a quadrangular shape which surrounds each seal member 2 represents a cutting line 55 in a cutting die, while the lower-stage portions represent the semiconductor device 1 manufactured by cutting along the cutting line 55.

Cutting and removal of an unnecessary lead frame portion are carried out by cutting the pair of screwing pieces 4 and leads 5a, 6a projecting from the seal member 2 rectilinearly in their width directions.

Figure 16:
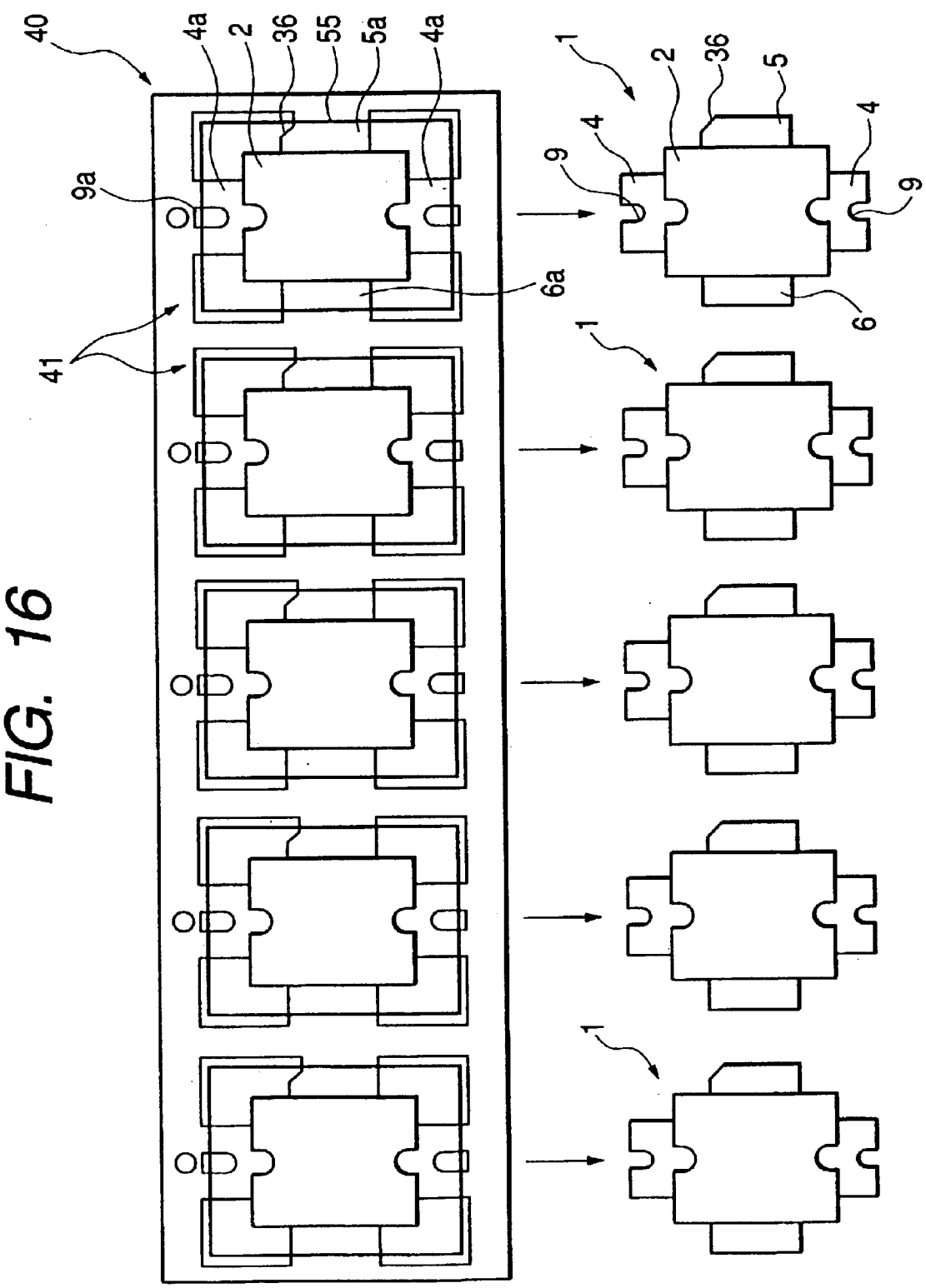
FIG. 16 is a schematic diagram showing in what state the semiconductor device of the first embodiment is manufactured as a device equipped with suspension leads by cutting the lead frame selectively.

As shown in FIG. 16, by cutting the leads 5a and 6a at positions spaced a predetermined distance from edges of the seal member 2 there can be obtained leads 5 and 6 as external electrode terminals. In cutting the leads 5a and 6a, the lead 5a is cut intermediate the polarity identifying portion 36 which becomes an oblique portion. As a result, an obliquely cut-out polar identifying portion 36 is formed at one corner of the outer end of the lead 5. Further, the screwing pieces 4a are cut so as to cross the holes 9a, whereby screwing pieces (suspension leads) 4 having screwing grooves 9 at respective outer ends can be formed, as shown in FIG. 2.

In this case, the cutting positions of the screwing pieces 4a may be set close to sides of the seal member 2, as shown in FIG. 17, whereby it is possible to prevent screwing grooves from being formed in the outer ends of the screwing pieces 4. In the semiconductor device 1 thus fabricated, the short screwing pieces 4 projecting from the seal member 2 are not used in mounting.

In any case, the leads 5 and 6 serve as a drain lead 5 and a gate lead 6, respectively. Further, the heat sink serves as a source electrode. The screwing pieces (suspension leads) 4 connected to the heat sink 3 can be used also as source electrodes (source leads).

Next, there are performed characteristic selection (electrical selection) and a mark forming work. Further, by bending in one step the pair of screwing grooves 4 projecting from side faces of the seal member 2 to form such gull wing-like leads as shown in FIG. 3, it is possible to manufacture such a semiconductor device 1 as shown in FIG. 3 in a plural number.

The back sides of the screwing pieces 4 are positioned on the same plane as the back side of the heat sink 3 or on a plane close thereto. This bending work may be done simultaneously with the cutting of the screwing pieces 4.

Figure 18A:
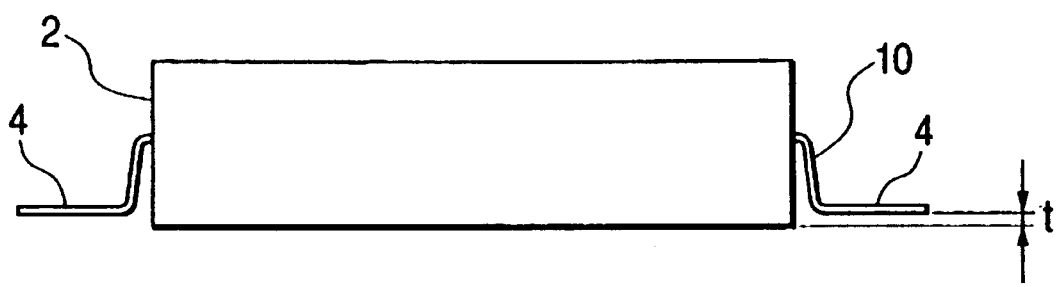
FIGS. 18(*a*) and 18(*b*) are a diagram and a graph, respectively, showing how a gap formed between a package bottom of the semiconductor device and a lower surface of each suspension lead, as well as thermal resistance and package breakdown occurrence rate, are correlated with each other.
Figure 18B:
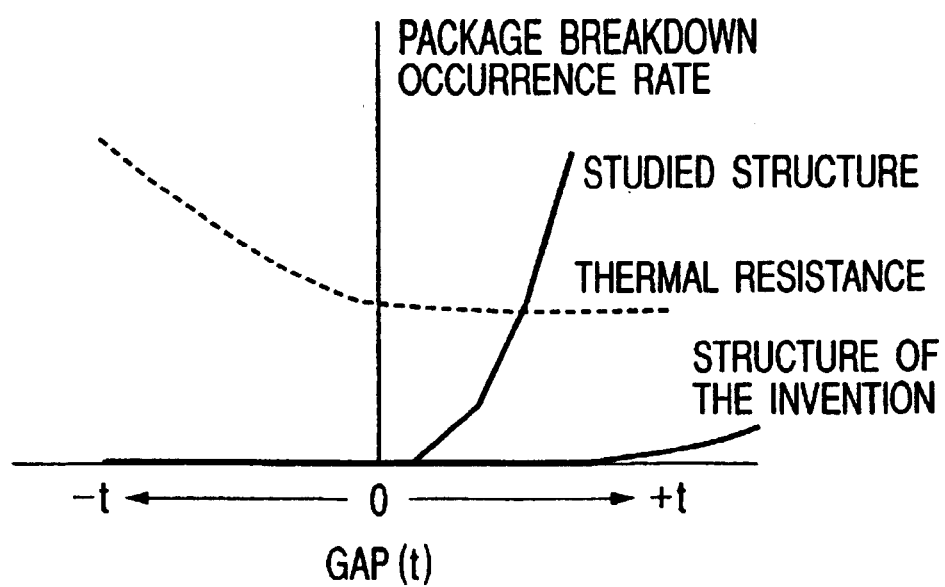

FIGS. 18(a) and 18(b) are a diagram and a graph, respectively, showing how a gap (t) formed between a package bottom (the bottom of the heat sink 3) in the semiconductor device 1 manufactured by the method of the first embodiment and a lower surface of each screwing piece (suspension lead) 4 is correlated with a thermal resistance and a package breakdown occurrence rate. More specifically, FIG. 18(a) is a schematic diagram of the semiconductor device 1, showing the gap (t), and FIG. 18(b) is a graph showing a correlation between the gap (t) and a thermal resistance as well as a package breakdown occurrence rate.

As is seen from the above graph, in the semiconductor device of the structure according to the present invention (the first embodiment) and in case of the gap (t) being minus (−), the larger the minus, the wider the gap from the mounting substrate at the time of mounting, with the result that the thermal resistance through the heat sink 3 increases rapidly. In case of the gap (t) being plus (+), the thermal resistance becomes constant because the heat sink 3 comes into contact with the mounting substrate.

Figure 28:
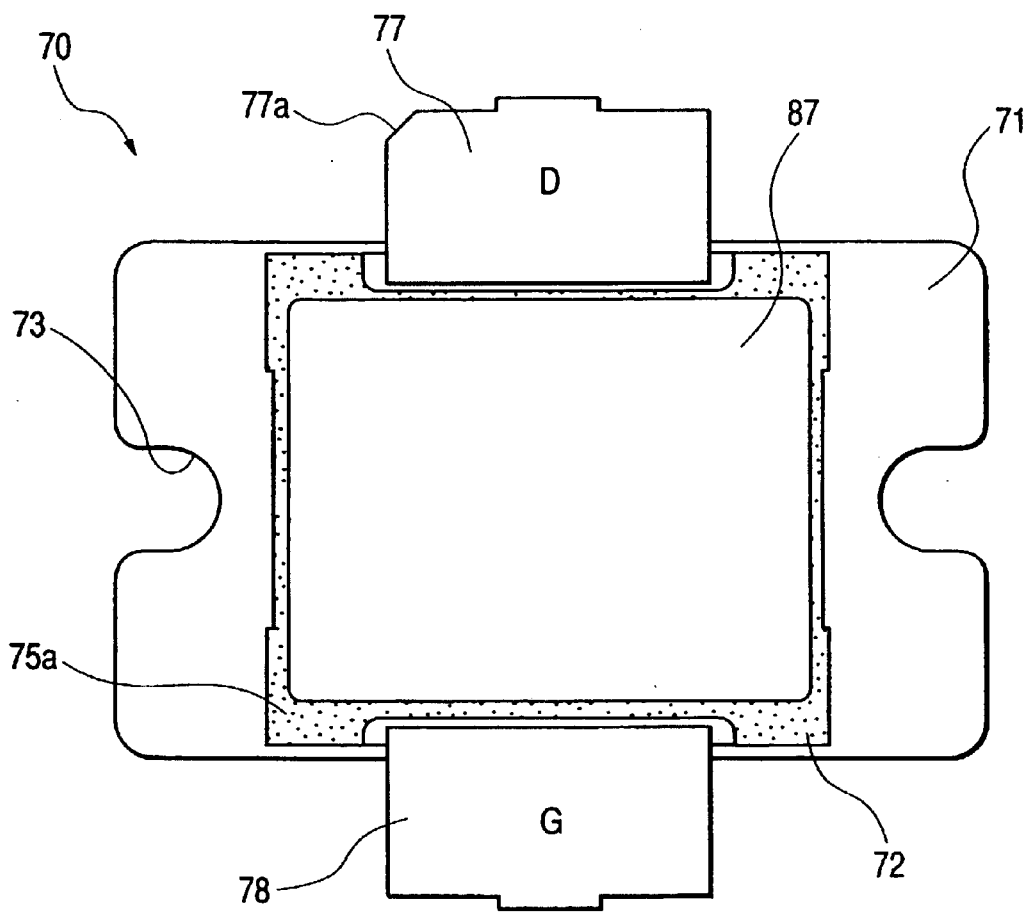
FIG. 28 is a plan view of the studied semiconductor device which the present inventor had studied prior to the present invention.
Figure 29:
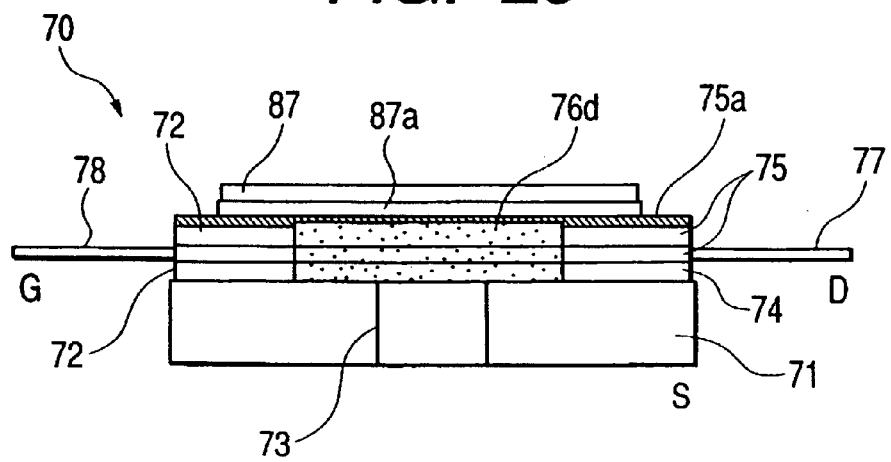
FIG. 29 is a side view thereof.
Figure 30:
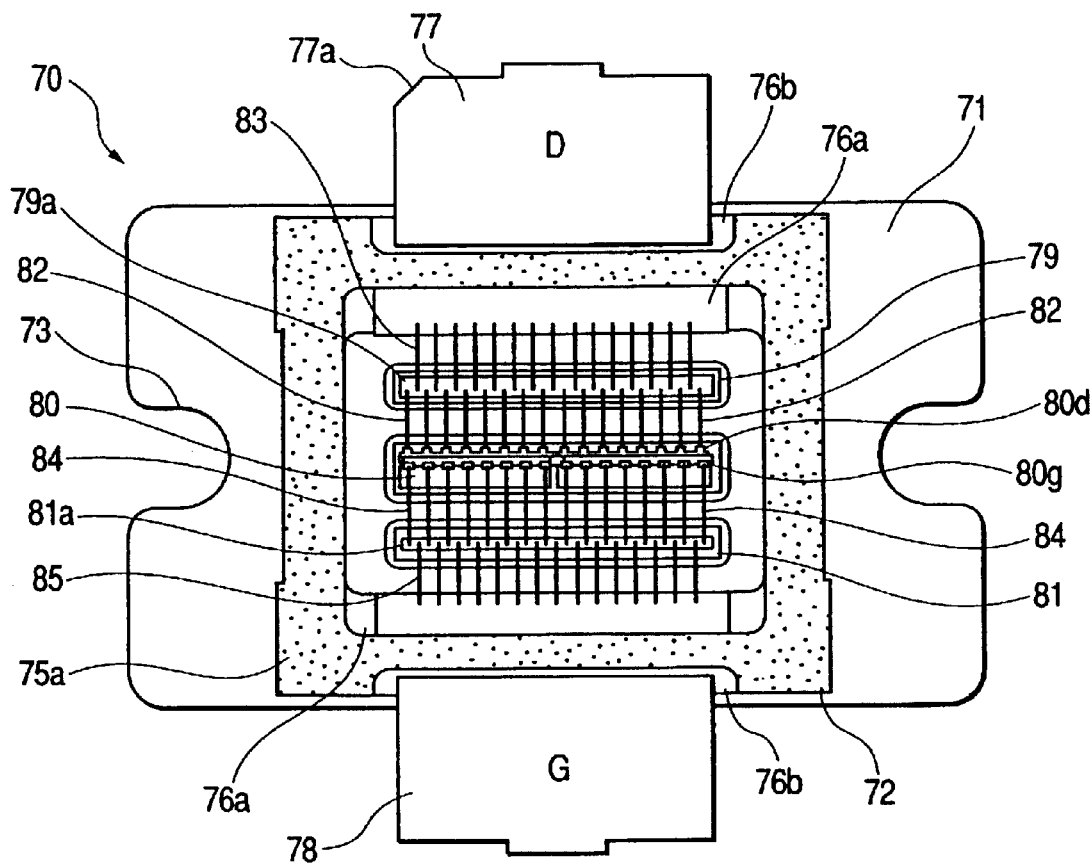
FIG. 30 is a plan view thereof with a cap removed.
Figure 31:
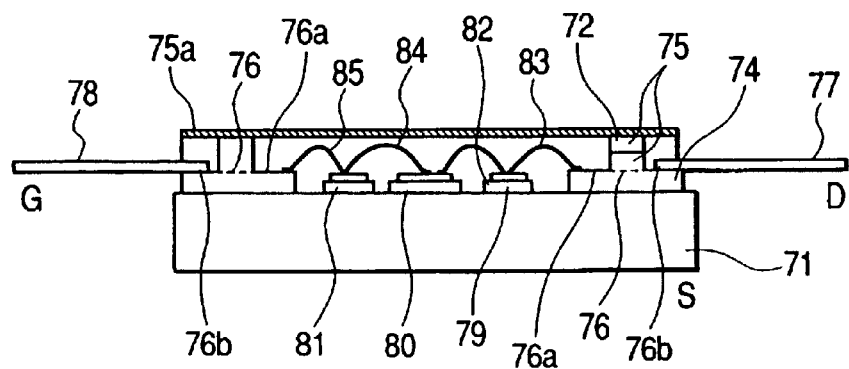
FIG. 31 is a schematic sectional view thereof.

In the semiconductor device of this first embodiment, by making the gap (t) plus, that is, by setting the lower surface of each suspension lead at a position higher than the back side (lower surface) of the heat sink 3, i.e., at a retracted position from the back side of the heat sink 3, it is possible to diminish the thermal resistance and also possible to make the package breakdown occurrence rate smaller than in the case of the studied semiconductor device shown in FIG. 28 and subsequent figures. In the graph of FIG. 18(b), the measurement result on the semiconductor device of the structure according to the present invention has been obtained in a screwed state of the suspension leads 4 to the mounting substrate, while the measurement result on the structure of the studied semiconductor device has been obtained in a fixed state of the heat sink to the mounting substrate directly with screws.

The following effects are obtained by the semiconductor device and manufacturing method for the same according to the first embodiment.

(1) According to the structure of the semiconductor device, the heat sink for heat radiation is thick, while the screwing pieces to be used in mounting the semiconductor device are thin, whereby a stress induced in mounting is absorbed by deformation of the stepped portions of the thin screwing pieces. Therefore, the heat sink no longer undergoes such a deformation as warping and hence it is possible to prevent damage of the semiconductor chips fixed to the heat sink.

(2) Since the set screw space so far provided in the heat sink 3 can be omitted, it is possible to decrease the amount of the expensive CuMo material used and hence possible to reduce the cost of the semiconductor device 1.

(3) Since the screwing pieces (suspension leads) 4 are thinner than the heat sink 3 and permit the selection of a material low in rigidity and superior in formability, a stress induced at the time of screwing in the mounting work can be absorbed by the bent portions 10 of the suspension leads 4. As a result, the heat sink machining accuracy can be mitigated and it is possible to reduce the package cost.

(4) Since it is only the heat sink portion that is required to have heat resistance in AuSi eutectic chip bonding, it suffices for only the heat sink 3 to be thick plated with Au. That is, it is possible to decrease the amount of the expensive Au used an hence possible to reduce the cost of the semiconductor device 1.

(5) In the resin molded package, in comparison with a ceramic package, both sealing material cost and machining cost are low; besides, hermetic seal inspection and dust particle inspection are not needed, thus making contribution to the reduction of cost and making it possible to reduce the cost of the semiconductor device 1.

(6) Since the plating of the leads 5 and 6 is an extremely thin Au plating, an Au plating removing work is not required on the user side, whereby the reduction of mounting cost can be attained. If the surfaces of the leads 5 and 6 are plated with any other plating material than Au, e.g., solder, it becomes unnecessary for the user to perform the Au plating removing work, whereby it is possible to attain the reduction of the mounting cost.

(7) By adoption of the resin molded package it becomes easy to attain the reduction in size and high integration of the semiconductor device in comparison with the ceramic package. More particularly, in the semiconductor device having a ceramic package, the ceramic package is compelled to become large in size in order to avoid contact of the chip holding collet with inner wall surfaces of the package at the time of chip bonding. On the other hand, in the case of a resin molded package, the size thereof can be reduced because chip bonding and wire bonding are performed in the absence of a package and thereafter the resin molded package is formed.

(8) Since the Al wire bonding work can be done at room temperature, the plating on the surface of the lead frame 40 is difficult to occur. Therefore, even if the Au plating formed on the surfaces of the leads 5a and 6a of the lead frame 40 is as thin as 0.2 $\mu$m or so, there does not arise any problem related to bondability. With a thin Au plating film of 0.2 $\mu$m or so, an intermetallic compound of AlAu cannot grow and hence it is possible to enhance the reliability. There also accrues an actual advantage that the Au removing work from the lead surfaces is not needed at the time of mounting performed on the user side.

(9) The lead frame and the heat sink are used in this first embodiment, but the heat sink is screwed to each of the product forming portions 41, so in the subsequent assembling work there can be utilized an assembling technique with the thus-assembled lead frame, whereby the assembling work can be done efficiently and consequently it is possible to reduce the semiconductor device manufacturing cost.

Second Embodiment

Figure 19:
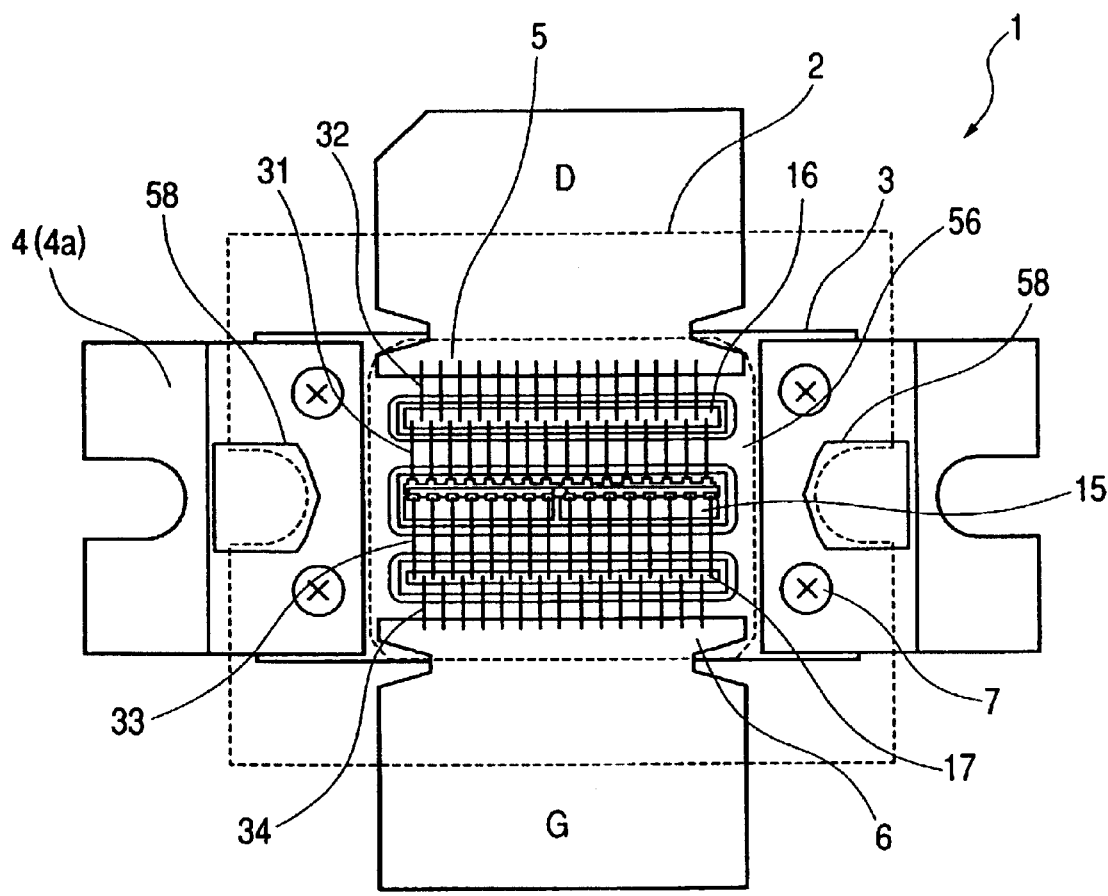
FIG. 19 is a perspective plan view showing the structure of a semiconductor device according to another embodiment (second embodiment) of the present invention.
Figure 20:
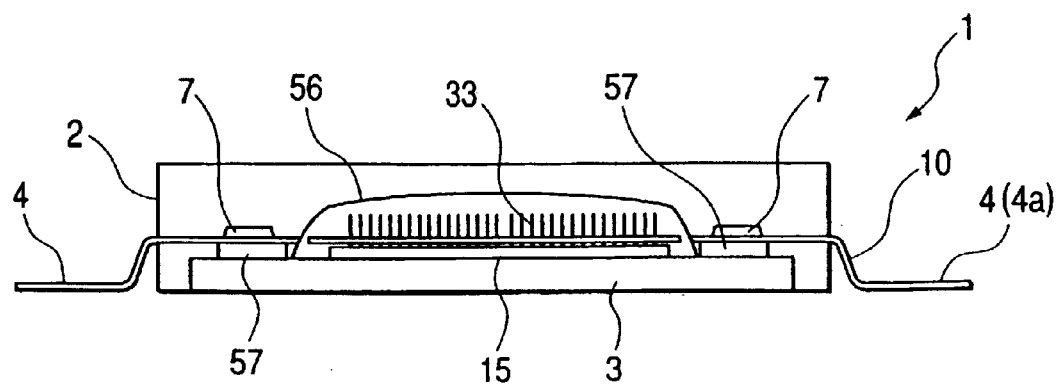
FIG. 20 is a schematic sectional view thereof.
Figure 21:
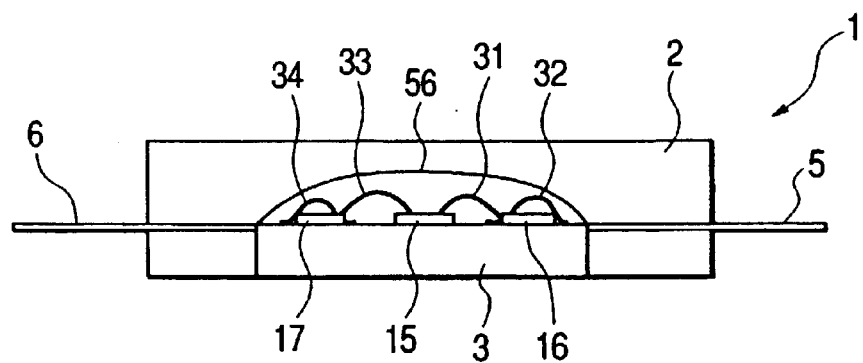
FIG. 21 is a schematic sectional view in another section of the semiconductor device of the second embodiment.

FIGS. 19 to 21 illustrate a semiconductor device according to another embodiment (second embodiment) of the present invention, of which FIG. 19 is a perspective plan view showing the structure of the semiconductor device, FIG. 20 is a schematic sectional view of the semiconductor device, and FIG. 21 is a schematic sectional view in another section of the semiconductor device.

According to the semiconductor device of this second embodiment, in the structure of the first embodiment there is adopted a double molded structure in which, as shown in FIGS. 19 to 21, the semiconductor chips 15, 16, 17 and the wires 31 to 34 are covered with undercoat resin 56, and the undercoat resin 56, etc. are sealed with the seal member 2.

The heat resistance of transfer molding resins presently in practical use is 150° C. or so, thus giving rise to the problem that it is impossible to cope with the junction temperature of Tj≧175° C. required of a power FET for a base station. Besides, there is a fear that a high frequency loss of a transfer molding resin may become unignorable against the market trend to an increase of operating frequency.

In view of this point, according to the structure of this second embodiment, the semiconductor chips 15, 16, 17, and the wires 31 to 34 are covered with a potting type undercoat resin superior in heat resistance and with little high frequency loss. By such a double molded structure using the under coat resin the chip surfaces which become the highest in temperature in the semiconductor device and the bonding wire portion as a high frequency current path can be covered with a potting resin having high heat resistance and low loss characteristics can be covered with the potting resin. Thus, the structure in question is effective for a semiconductor device for a radio base station with a junction temperature as high as 150 to 200° C. Therefore, this structure is effectively applicable to a semiconductor device of a high frequency output of 50W or more.

For the prevention of wire breaking during the application of the undercoat resin it is preferable that the whole surfaces of the chips and the wires be covered with the undercoat resin. But in the case of the structure of the previous first embodiment, the undercoat resin flows down from the gap between the leads and the heat sink, making it impossible to cover the whole of the wires.

In this second embodiment, in view of the point just mentioned above, the inner ends of the leads 5 and 6 are positioned on the heat sink 3 to prevent flowing and loss of the undercoat resin 56, as shown in FIG. 19. In this case, for electrical insulation between the leads 5, 6 and the heat sink 3, as shown in FIG. 20, spacers 57 each constituted by a doughnut-like insulator are sandwiched in between the screwing pieces 4a and the heat sink 3 to ensure insulation between the heat sink and the screwing pieces 4a. Thus interposing the spacers 57 between the heat sink 3 and the screwing pieces 4a means that in the assembled state the screwing pieces 4a and the leads 5, 6 (leads 5a, 6a) are spaced apart a distance corresponding to the thickness of each spacer 57.

Consequently, at the time of application of the undercoat resin, the resin which has flowed down between the inner end sides of the leads 5a, 6a and the wires 31 to 34 gets on the heat sink 3 and no longer flows away, but covers the wires 31 to 34, further covers the semiconductor chips 15, 16, 17 and the leads 5a, 6a.

According to such a structure wherein the spacers 57 are used to ensure gaps between the heat sink and the lead frame (leads 5a, 6a, and the screwing pieces 4a), at the time of clamping with a molding die in transfer molding, the screwing pieces 4a (4) are deformed when the heat sink 3 is pushed against the lower mold of the die, and thus there is a fear that the clamping operation may not be carried out in a satisfactory manner. In this second embodiment, therefore, holes (upper mold through holes) 58 for passage therethrough of the upper mold are formed in the screwing pieces 4a to prevent deformation of the screwing pieces 4a. That is, the holes 58 are heat sink pressing type windows.

In this second embodiment, the undercoat resin material and the resin material which forms the seal member can be selected in accordance with separate specifications, it is possible to easily improve the characteristics and reliability of the semiconductor device 1.

Figure 22:
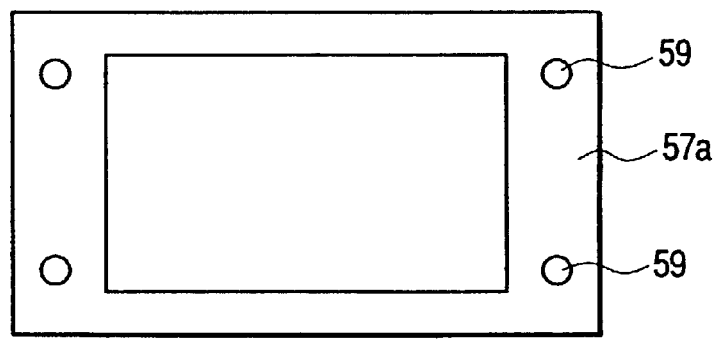
FIG. 22 is a plan view of a spacer used in a semiconductor device according to a modification of the second embodiment.

FIG. 22 is a plan view of a spacer used in a semiconductor device according to a modification of the second embodiment. In the illustrated example, spacers 57 formed of an insulator and having an external shape almost equal to that of the heat sink 3 are interposed between the heat sink 3 and the leads 5a, 6a (5, 6) as well as the screwing pieces 4a (4). The spacers 57a are formed with tapped holes 59 for insertion therein of screws 7.

Since the insulating spacers 57a have such a structure as illustrated in the figure, they are disposed also under the leads 5*a* and 6*a* (5, 6), so that the insulation between the leads 5, 6 and the heat sink 3 is ensured and the reliability of the semiconductor device 1 is improved.

According to this structure, moreover, vertical movements (fluttering) of the leads 5 and 6 are diminished, ultrasonic oscillation in wire bonding can surely be applied to the wire, thus permitting a highly accurate wire bonding. As a result, it is possible to provide a semiconductor device 1 with high wire connectability.

The leads of a semiconductor device used in a high frequency amplifier circuit constitute a part of a high frequency circuit, so an appropriate capacitance is required as the case may be. When such spacers 27*a* as shown in FIG. 22 are interposed between the leads 5, 6 and the heat sink 3, they function as dielectrics and therefore a required capacitance can be obtained by combining lead area, lead-heat sink spacing, and lead-heat sink dielectric constant with one another, also permitting the improvement in efficiency of the high frequency amplification circuit.

Figure 23:
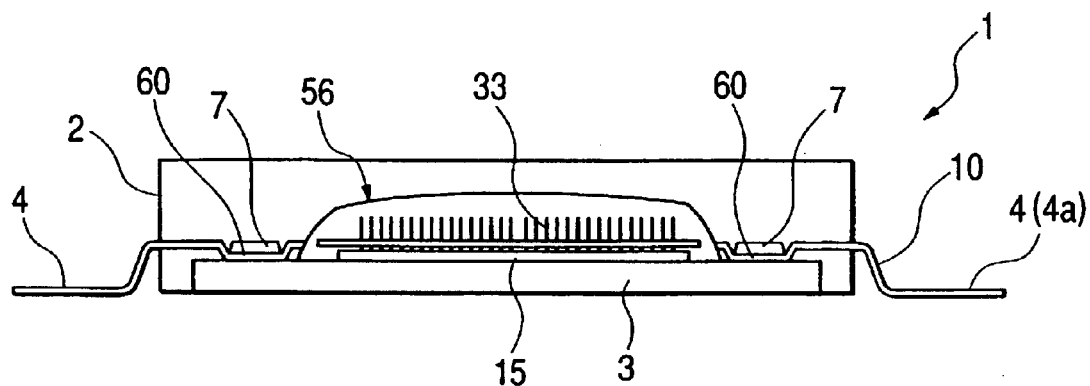
FIG. 23 is a schematic sectional view showing the structure of a semiconductor device according to another modification of the second embodiment.

FIG. 23 is a schematic sectional view showing the structure of a semiconductor device according to another modification of the second embodiment. In this modification there is proposed another structure for ensuring a gap between the lead frame and the heat sink. More specifically, as shown in the same figure, the portions of the screwing pieces 4*a* (4) where guide holes 46 are to be formed are subjected to embossing and are thereby formed lower than the portions adjacent thereto, and the lower portions, indicated at 60, are fixed to the heat sink 3 with screws 7, whereby the screwing pieces 4*a* and the leads 5*a*, 6*a* (5, 6) are made higher by a predetermined spacing from the main surface of the heat sink 3 to form gaps.

Third Embodiment

Figure 24:
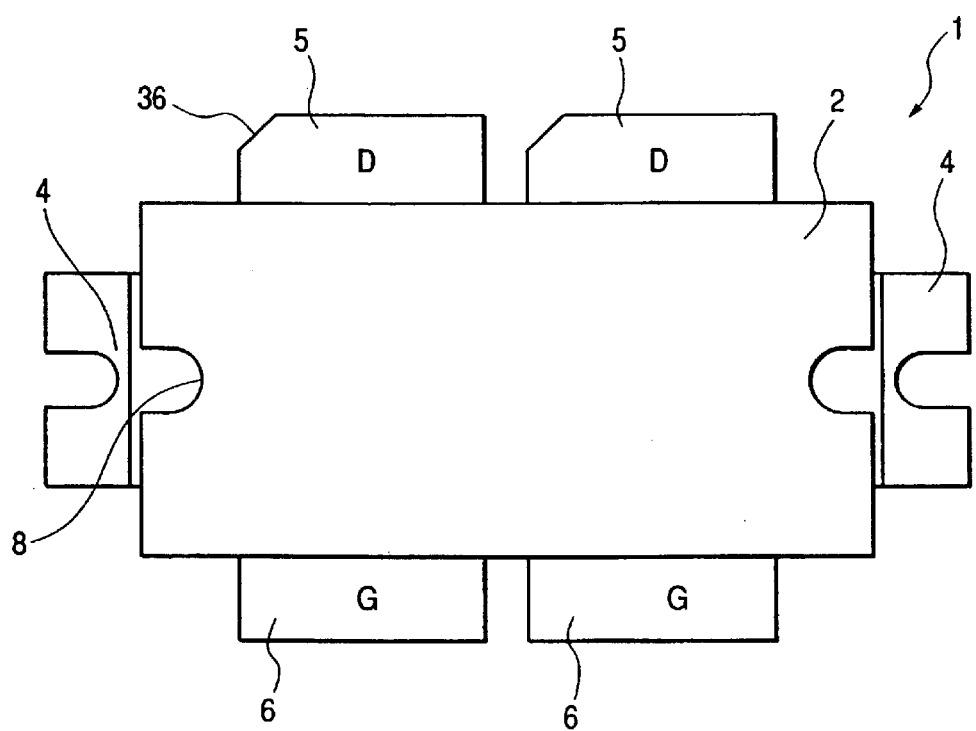
FIG. 24 is a plan view of a semiconductor device according to a further embodiment (third embodiment) of the present invention.
Figure 25:
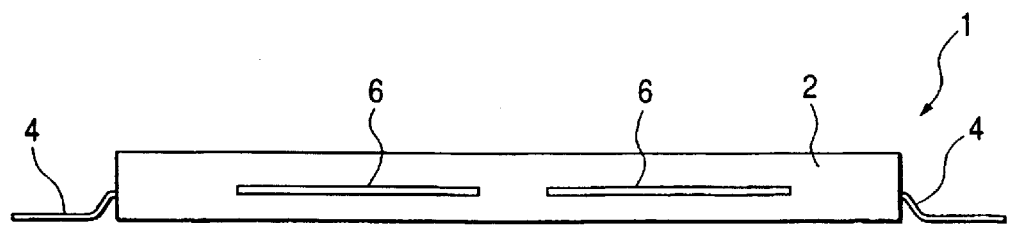
FIG. 25 is a front view of thereof.

FIG. 24 is a plan view of a semiconductor device according to a further embodiment (third embodiment) of the present invention and FIG. 25 is a front view thereof. This third embodiment shows an example in which the drain and gate leads 5, 6 of the structures described in the first embodiment are each arranged side by side in a plural number. In this third embodiment, two sets of drain and gate leads 5, 6 are arranged side by side. With such a structure, it is possible to increase the output.

Fourth Embodiment

Figure 26:
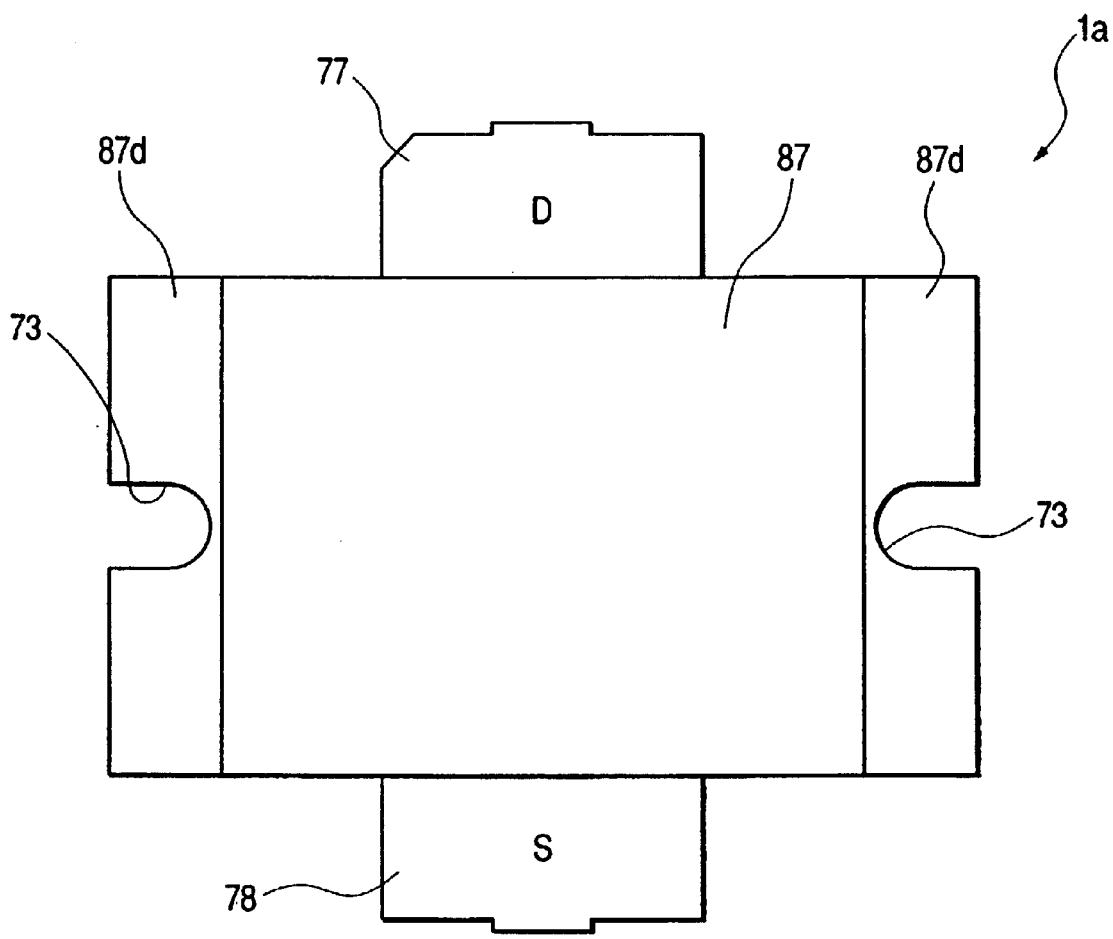
FIG. 26 is a plan view of a semiconductor device according to a still further embodiment (fourth embodiment) of the present invention.
Figure 27:
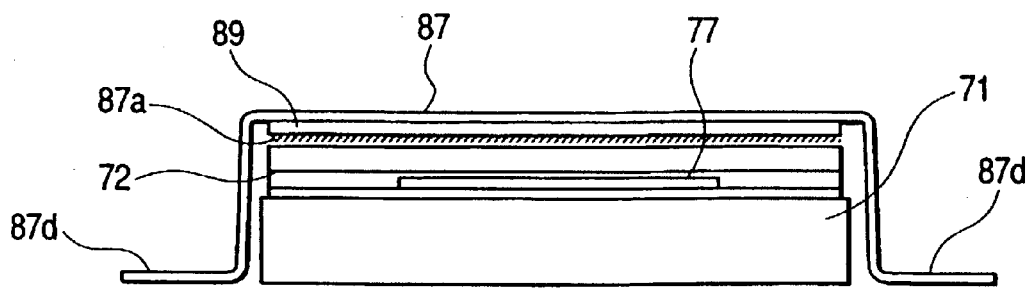
FIG. 27 is a side view thereof.

FIG. 26 is a plan view of a semiconductor device according to a still further embodiment (fourth embodiment) of the present invention and FIG. 27 is a side view thereof. In this fourth embodiment the present invention is applied to a ceramic package.

According to the semiconductor device, indicated at 1*a*, of this fourth embodiment, in the studied semiconductor device, a metallic cap 87 is extended long on both end sides of the frame 72 constituted by a ceramic laminate, and extended portions 87*d* are bent in one step, then extend so that lower surfaces thereof are positioned on a plane coincident with or close to the back side of the heat sink 71. In outer ends of the extended portions 87*d* are formed screwing grooves 73.

The cap 87 is bonded through AuSn alloy 89 to the plating film 87*a* formed on an upper surface of the frame 72. The cap 87 is formed so as to become equal in potential as the source electrode. Thus, the extended portions 87*d* are employable also as source electrodes.

Although the present invention has been described above on the basis of embodiments thereof, it goes without saying that the invention is not limited to those embodiments and that various changes may be made within the scope not departing from the gist thereof. Although in the above embodiments screws are used to mount the respective semiconductor devices, the invention is also applicable to semiconductor devices which are mounted by the reflow of solder.

The following is a brief description of effects obtained by typical inventions disclosed herein.

(1) It is possible to reduce the material cost, reduce the cost of assembling, including sealing, and further reduce the inspection cost, and hence possible to reduce the semiconductor device manufacturing cost.

(2) It is possible to provide a semiconductor device wherein the warp of a heat sink is difficult to occur, and hence possible to improve the reliability of mounting.

What is claimed is:

1. A method of manufacturing a semiconductor device, comprising the steps of:

providing a lead frame and a heat sink, the lead frame being constituted by a metallic plate having one or more product forming portions of a predetermined pattern, the heat sink being constituted by a flat metallic plate of a high thermal conductivity which is fixed to the product forming portions with screws;

fixing one or plural semiconductor chips to a main surface of the heat sink;

superimposing the heat sink on back sides of the product forming portions of the lead frame and fixing the heat sink to the lead frame with screws from a main surface side of the lead frame;

connecting between electrodes of the semiconductor chips and inner ends of corresponding leads and also between predetermined electrodes of predetermined semiconductor chips, using conductive wires;

covering the main surface side of the heat sink and a predetermined portion of the lead frame with an insulating resin by one-side transfer molding to form an insulating seal member; and cutting off an unnecessary portion of the lead frame, allowing a back side of the heat sink which is insulative to be exposed to a back side of the seal member and allowing the leads to be projected from side faces of the seal member, the product forming portions each comprising:

a pair of screwing pieces having respective inner end portions connected with screws respectively to right and left ends of the heat sink on the main surface side of the heat sink, the screwing pieces further having outer end portions projecting to the exterior of the seal member, the outer end portions having respective through spaces for screwing which are used at the time of mounting the semiconductor device;

a first lead having an inner end portion which is positioned within the seal member and whose inner end is arranged near one side face of the heat sink and further having an outer end portion projecting from the seal member; and a second lead having an inner end portion positioned within the seal member and near another side face of the heat sink and further having an outer end portion projecting from the seal member, wherein in the step of cutting off the unnecessary portion of the lead frame, or thereafter, the leads projecting from the side faces of the seal member are bent in one step to form surface-mounted type leads.

2. A method according to claim 1, wherein the screwing pieces are cut so that there remain the through spaces for screwing, and the screwing pieces are bent in one step at intermediate portions thereof extending from the seal member, then extend so that back sides thereof are each positioned on a plane on which the back side of the heat sink is positioned, or on a plane close to said plane.

3. A method according to claim 1, wherein the screwing pieces are cut respectively at positions close to edges of the seal member in such a manner that the through spaces for screwing do not remain.

4. A method according to claim 1, wherein the heat sink is formed of a thick material difficult to deform, while the screwing pieces are formed of a flexible material easy to deform.

5. A method according to claim 1, further comprising the steps of:

positioning the first and second leads in such a manner that the respective inner ends overlap the heat sink inside the heat sink and spacedly a predetermined distance from side edges of the heat sink;

superimposing the first and second leads on the heat sink through insulating spacers and subsequently performing the wire bonding;

covering the semiconductor chips and the wires with resin higher in heat resistance than the resin which constitutes the seal member, to form an undercoat resin; and in the one-side transfer molding, clamping and holding portions of the heat sink as well as the screwing pieces and spacers superimposed on the heat sink, with use of a molding die, and forming the seal member which covers all of the semiconductor chips, the wires and the undercoat resin.

6. A method according to claim 1, further comprising the step of:

fixing a semiconductor chip with a field effect transistor formed thereon and semiconductor chips with capacitors formed thereon to the main surface of the heat sink in such a manner the capacitor-formed semiconductor chips are positioned on both sides in the gate-drain direction of the field effect transistor-formed semiconductor chip, wherein, in the wire bonding step, a drain electrode on an upper surface of the field effect transistor and an upper electrode of one of the capacitor-formed semiconductor chips are connected with each other through a plurality of wires, and the upper electrode and the first lead are connected with each other through a plurality of the wires, and wherein a gate electrode on the upper surface of the field effect transistor and an upper electrode of the other capacitor-formed semiconductor chip are connected with each other through a plurality of wires, and the upper electrode and the second lead are connected with each other through a plurality of the wires, to constitute a high frequency power amplifier for a base station.

* * * * *